US011122720B2

(12) United States Patent
Morikawa et al.

(10) Patent No.: US 11,122,720 B2
(45) Date of Patent: Sep. 14, 2021

(54) COMPONENT FEEDER

(71) Applicant: FUJI CORPORATION, Chiryu (JP)

(72) Inventors: Shunji Morikawa, Toyoake (JP);
Toshihiro Nonomura, Toyota (JP)

(73) Assignee: FUJI CORPORATION, Chiryu (JP)

( * ) Notice: Subject to any disclaimer, the term of this patent is extended or adjusted under 35 U.S.C. 154(b) by 792 days.

(21) Appl. No.: 15/743,388

(22) PCT Filed: Jul. 24, 2015

(86) PCT No.: PCT/JP2015/071107
§ 371 (c)(1),
(2) Date: Sep. 25, 2018

(87) PCT Pub. No.: WO2017/017729
PCT Pub. Date: Feb. 2, 2017

(65) Prior Publication Data
US 2019/0029151 A1    Jan. 24, 2019

(51) Int. Cl.
*H05K 13/04* (2006.01)
*H05K 13/02* (2006.01)
*H05K 13/08* (2006.01)

(52) U.S. Cl.
CPC ....... *H05K 13/0421* (2013.01); *H05K 13/026* (2013.01); *H05K 13/0417* (2013.01); *H05K 13/0419* (2018.08); *H05K 13/086* (2018.08)

(58) Field of Classification Search
CPC .......... H05K 13/0421; H05K 13/0419; H05K 13/086; H05K 13/026; H05K 13/0417; H05K 13/0092

(Continued)

(56) References Cited

U.S. PATENT DOCUMENTS 4,054,988 A * 10/1977 Masuzima ......... H05K 13/0408
29/564.6
4,245,385 A *  1/1981 Zemek ............... H05K 13/0473
29/564.8

(Continued)

FOREIGN PATENT DOCUMENTS

JP    57-134993 A    8/1982
JP    63-136699 A    6/1988

(Continued)

OTHER PUBLICATIONS

International Search Report dated Oct. 20, 2015 in PCT/JP2015/071107 filed Jul. 24, 2015.

*Primary Examiner* — Minh N Trinh
(74) *Attorney, Agent, or Firm* — Oblon, McClelland, Maier & Neustadt, L.L.P.

(57) ABSTRACT

A component feeder includes a feeding mechanism which feeds taped components in which components with leads having a plurality of leads are held on a carrier tape by the plurality of leads, and a positioning mechanism which positions each of the plurality of leads included in the component at the supply position. The positioning mechanism includes a clamp which is configured to include a first member and a second member that are operated relative to each other, and a guide section which guides each of the plurality of leads to a defined position in a feeding direction of the taped component when the plurality of leads are pinched by the clamp. The component feeder includes a clamp closed position checking mechanism for checking whether or not a closed position which is an operation position of the clamp in a state where the clamp is closed is an appropriate position.

7 Claims, 16 Drawing Sheets

(58) Field of Classification Search
USPC .................................................. 29/835–838
See application file for complete search history.

(56) References Cited

U.S. PATENT DOCUMENTS

| | | | | |
|---|---|---|---|---|
| 4,293,999 A * | 10/1981 | Woodman, Jr. .... | H05K 13/0417 |
| | | | | 29/564.6 |
| 5,024,129 A * | 6/1991 | Holcomb ........... | H05K 13/0092 |
| | | | | 83/107 |
| 5,074,033 A * | 12/1991 | Dassance ............. | H01R 43/055 |
| | | | | 29/753 |
| 10,905,040 B2 * | 1/2021 | Otsubo .............. | H05K 13/0419 |
| 2016/0198601 A1 * | 7/2016 | Maeda ............... | H05K 13/0812 |
| | | | | 29/739 |

FOREIGN PATENT DOCUMENTS

| | | |
|---|---|---|
| JP | 1-183892 A | 7/1989 |
| JP | 3-218099 A | 9/1991 |
| JP | 7-106797 A | 4/1995 |
| JP | 2007-180280 A | 7/2007 |
| JP | 2013-179190 A | 9/2013 |

* cited by examiner (a)

(b)

(c)

(a)

(b) THICK LEAD — NORMAL CLAMP / (c) ABNORMAL CLAMP
(d) NARROW LEAD — NORMAL CLAMP / (e) ABNORMAL CLAMP

COMPONENT FEEDER

BACKGROUND OF THE INVENTION

Field of the Invention

The present invention relates to a component feeder for supplying a componentin that the component feeder consecutively supplies the component to a predetermined supply position by using a taped component.

Description of Related Art

For example, a component feeder described in the following Patent Literature is employed such that multiple components, such as electronic components, are acquired as a taped component held by a carrier tape, and the components are supplied from the taped component.

BRIEF SUMMARY OF THE INVENTION

A component feeder described in the Patent Literature has large room for improvement, and by certain improvement, it is possible to improve practicability of the component feeder. The present invention has been made in consideration of the above-described situation, and an object thereof is to provide a component feeder having high practicability.

In order to solve the above-described problem, there is provided a component feeder which includes a feeding mechanism which feeds taped components in which components with leads having a plurality of leads are held on a carrier tape by the plurality of leads at a predetermined disposition pitch, at a predetermined feeding pitch, and which consecutively supplies one component at a predetermined supply position, the component feeder including: a positioning mechanism which positions each of the plurality of leads included in the component at the supply position, in which the positioning mechanism includes a clamp which is configured to include a first member and a second member that are operated relative to each other, and to perform an opening and closing action, and which pinches the plurality of leads by a pinching section provided in each of the first member and the second member in a closed state, and a guide section which is provided in one of the first member and the second member, and guides each of the plurality of leads to a defined position in a feeding direction of the taped component when the plurality of leads are pinched by the clamp, and in which the component feeder includes a clamp closed position checking mechanism for checking whether or not a closed position which is an operation position of the clamp in a state where the clamp is closed is an appropriate position.

In a case where any of the plurality of leads is bent, it is predicted that the guide section guides the bent lead to the defined position of the other lead. In this case, since two or more leads exist in the vicinity of one defined position, a state where the clamp is not closed even when the clamp is desired to be closed, may be achieved. In this state, the closed position of the clamp does not become an appropriate position. According to the component feeder of the present invention, it is possible to easily detect the state of an inappropriate lead, such as a bending of the lead, or positioning of the lead at an inappropriate position, based on a function of the clamp closed position checking mechanism.

Hereinafter, in the specification, several aspects of the invention (hereinafter, there is a case of being called "invention that can be claimed") that are recognized to be capable of being claimed, are described as an example and will be described. Similar to the range of the claims, each of the aspects is divided into clauses, numbers are given to each of the clauses, and the aspects are described referring to the numbers of other clauses as necessary. This is merely for making it easy to understand the invention that can be claimed, and is not for limiting the contents described in each of the following clauses by combining the constituent elements that configure the invention. In other words, the invention that can be claimed is supposed to be described following each of the following clauses, and to be interpreted by considering the description or the like of the embodiment, and as long as following the interpretation, an aspect to which other constituent elements are further given to the aspect of each of the clauses, and an aspect from which certain constituent elements are eliminated from the aspect of each of the clauses, can become one aspect of the invention that can be claimed.

(1) A component feeder which includes a feeding mechanism which feeds taped components in which a component is held by a plurality of leads at a predetermined disposition pitch on a carrier tape, at a predetermined feeding pitch, and which consecutively supplies one component at a predetermined supply position.

An aspect of the clause is an aspect that is a foundation of the aspects of the invention. In addition, the disposition pitch and the feeding pitch generally match each other, but for example, an aspect in which the taped component is fed only at the disposition pitch as a result of feeding the component at the feeding pitch plural times.

(2) The component feeder according to clause (1), in which feed holes are provided at a constant hole pitch on the carrier tape, and the feeding mechanism feeds the taped component at the feeding pitch by engaging a claw with the feed hole and moving the claw.

The aspect is an aspect into which restriction related to a structure of the feeding mechanism is added. Similar to a sprocket, in a case where a structure in which the plurality of claws are formed at an outer circumference of a circular plate that becomes a base is used, it is possible to employ a structure in which the claws are moved to be rotated, and in a case where a movable body having one claw is used, it is possible to employ a structure in which the movable body is linearly moved only at a feeding pitch in a feeding direction of the taped component. In addition, the hole pitch and the feeding pitch are not required to match each other. For example, in a case where the sprocket is used, a case where the hole pitch and the feeding pitch do not match each other is also possible.

(3) The component feeder according to clause (1) or (2), in which, in the taped component, the component with leads including the plurality of leads is held by the carrier tape in the plurality of leads.

The aspect is an aspect into which restriction related to the component and the taped component is added. In the taped component which is obtained by making the component with leads into a tape, the above-described disposition pitch, the feeding pitch, and the hole pitch generally match each other.

(4) The component feeder according to clause (3), in which the component feeder includes a positioning mechanism which positions each of the plurality of leads included in the component at the supply position.

In a case of the component with leads, the leads are inserted into holes provided on a board in many cases, and it is desirable to perform the positioning of the lead at the supply position. The aspect is an aspect considering this.

(5) The component feeder according to clause (4), in which the positioning mechanism includes a clamp which is configured to include a first member and a second member that are operated relative to each other, and to perform an opening and closing action, and which pinches the plurality of leads by a pinching section provided in each of the first member and the second member in a closed state.

By using the clamp of the aspect, it is possible to accurately position the lead of the component with leads at the supply position.

(6) The component feeder according to clause (5), in which the opening and closing action of the clamp is interlocked with an operation of the feeding mechanism.

According to the aspect, since it is possible to perform the opening and closing action of the clamp by a driving source of the feeding mechanism, it is possible to reduce the driving source.

(7) The component feeder according to clause (5) or (6), in which the component feeder includes a lead cutting mechanism which is configured to include one pair of blades provided in one and the other one of the first member and the second member, and to cut each of the plurality of leads pinched by the pinching section on a distal end side of a part pinched by the pinching section, by the opening and closing action of the clamp.

It is desirable that the component with leads have a relatively long lead and the lead is prepared to have an appropriate length while the component is used. According to the aspect, since the lead pinched by the clamp is cut by the opening and closing action of the clamp, it is possible to prepare the lead at the supply position by a simple structure.

(8) The component feeder according to any one of clauses (5) to (7), in which the positioning mechanism includes a guide section which is provided in one of the first member and the second member, and guides each of the plurality of leads to a defined position in a feeding direction of the taped component when the plurality of leads are pinched by the clamp.

The clamp generally pinches the lead in a direction perpendicular to the feeding direction, and in a case of using the clamp, when pinching the lead by the clamp, it is desirable to position each of the leads at a defined position in the feeding direction. According to the aspect, the positioning of each of the leads is appropriately performed in the feeding direction by the guide section. In general, the guide section is configured to be provided to protrude from one pinching section between the first member and the second member toward the other one of the first member and the second member, and to guide the lead to the defined position as the clamp is closed.

(9) The component feeder according to clause (8), in which the guide section is configured to be provided corresponding to the plurality of leads, and to include a plurality of V notches in which each of the first member and the second member is open toward the other one.

When the V notches are employed, even in a case where the position of the lead is shifted in an appropriate range from the defined position, only by pinching the lead by the clamp, the lead is guided to a part that becomes a bottom of the V notch, and it is possible to easily perform the positioning of the lead in the feeding direction.

(10) The component feeder according to clause (8) or (9), in which the guide section is exchangeable depending on the component.

In a case of handling various components, the number of leads, the diameter of leads, an interval between the leads or the like, vary according to the type of the component. According to the aspect of the clause, it is possible to easily perform the positioning of the lead that corresponds to various components.

(11) The component feeder according to clause (10), in which the pinching section of one of the first member and the second member, and the guide section are integrated with each other, and the guide section is exchangeable together with the pinching section.

For example, a case where the guide section is configured of a relatively thin plate-like member, and the member is attached to the pinching section to be exchangeable, is also considered. In this configuration, when the lead is positioned at an inappropriate position (for example, when the lead is positioned at a position shifted from an opening of the V notch), a situation in which the plate-like member is lifted up by the bent lead while the lead is bent by the distal end of the plate-like member, is predicted. According to the aspect of the clause, since the guide section and the pinching section are integrated with each other, as rigidity of the guide section is improved, it is possible to avoid the situation. In addition, a case where integration is an aspect in which the integral molding is performed by the same materials, is desirable.

(21) The component feeder according to any one of clauses (8) to (11), in which the component feeder includes a clamp closed position checking mechanism for checking whether or not a closed position which is an operation position of the clamp in a state where the clamp is closed is an appropriate position.

In a case where any of the plurality of leads is bent, it is predicted that the guide section guides the bent lead to the defined position of the other lead. In this case, since two or more leads exist in the vicinity of one defined position, a state where the clamp is not closed even when the clamp is desired to be closed, may be achieved. In this state, the closed position of the clamp does not become an appropriate position. According to the aspect, it is possible to easily detect an inappropriate state of the lead, such as bending of the lead, positioning of the lead at an inappropriate position, or the like, based on the function of the clamp closed position checking mechanism. Incidentally, considering the above-described function, the clamp closed position checking mechanism can be considered as one type of a lead position checking mechanism which will be described later.

(22) The component feeder according to clause (21), in which the clamp closed position checking mechanism is configured to include a detection target section provided in the guide section and a sensor which regards the detection target section as a target of detection, and to be capable of detecting whether or not the closed position of the clamp is the appropriate position depending on the presence or absence of the detection of the detection target section by the sensor.

The aspect is an aspect into which restriction related to the configuration of the clamp closed position checking mechanism is added, and according to the aspect, it is possible to detect whether or not the closed position of the clamp is an appropriate position by the simple configuration.

(23) The component feeder according to clause (22), in which the guide section is exchangeable depending on the component, and even in the guide section which is exchangeable or the like, the detection target section is provided at a position that corresponds to a diameter of the plurality of leads.

In a case where various components with a lead is a target, the diameter of the leads varies depending on the component. When the diameter of the leads varies, the appropriate closed position of the clamp varies. Meanwhile, as described in advance, from the difference in position or number of the leads, the guide section is exchanged depending on the component. Therefore, by providing the detection target section that corresponds to the component in the exchangeable guide section, it is possible to easily check the closed position of the clamp that corresponds to the component without changing the position of the sensor, or the like.

(31) The component feeder according to any of clauses (3) to (23), in which a lead position checking mechanism which is provided on an upstream side of the supply position in the feeding direction of the taped component, and which checks whether or not the position in each of the feeding directions of the plurality of leads included in the component fed to the supply position by the feeding mechanism, is an appropriate position, is further provided.

As described in advance, there is a case where a feeding amount by the feeding mechanism is not appropriate, or a case where the positions of each of the leads are not positioned at appropriate positions at the supply position, due to the bending of the lead. Considering the situation, according to the aspect, it is possible to check whether or not the position of the lead of the component to be supplied at the supply position is an appropriate position, on the upstream side of the supply position. Incidentally, the clamp closed position checking mechanism described in advance is a mechanism which checks whether or not the lead is positioned at an appropriate position at the supply position, and is the same type as the lead position checking mechanism, but is different from the lead position checking mechanism of the aspect in that the position at which the checking is performed is the supply position or the upstream side thereof.

(32) The component feeder according to clause (31), in which the lead position checking mechanism includes (a) a movable body which can perform an advancing and retreating operation with respect to the plurality of leads, and (b) a comb section which is provided in the movable body, and in which a plurality of cutouts that allows passage of each of the plurality of leads is provided when the movable body advances in a case where the plurality of leads are at an appropriate position, and in which it is possible to check whether or not each of the plurality of leads is at an appropriate position based on whether or not the movable body advances.

The aspect is an aspect into which restriction related to the configuration of the lead position checking mechanism is added, and in the aspect, in a case where each of the leads is at an appropriate position, the movable body provided with the comb section is allowed to advance. Therefore, for example, by detecting the advancing position of the movable body, it is possible to easily detect whether or not each of the leads is at an appropriate position.

(33) The component feeder according to clause (32) in which the comb section is exchangeable depending on the component.

As described above, the diameter of the leads, the number of the leads, the position of each of the leads, or the like, vary according to the component. Therefore, the aspect in which the comb section is exchangeable depending on the component, can correspond to various components.

(34) The component feeder according to clause (32) or (33), in which the advancing and retreating operation of the movable body is configured to be interlocked with the operation of the feeding mechanism.

According to the aspect, since it is possible to perform the opening and closing action of the movable body by the driving source of the feeding mechanism, it is possible to reduce the driving source.

(35) The component feeder according to any one of clauses (32) or (34), in which a feeding checking mechanism in which feed holes are provided at a constant hole pitch in the carrier tape, the feeding mechanism is configured to feed the taped component at the feeding pitch by engaging a claw with the feed hole and by moving the claw, a pin inserted into the feed hole is provided in the movable body, the component feeder checks whether or not the taped component is fed at the feeding pitch by the feeding mechanism based on the insertion of the pin into the feed hole, is further provided.

The aspect can be considered as an aspect in which the lead position checking mechanism and the feeding checking mechanism which will be described later are integrated with each other.

(41) The component feeder according to any one of clauses (1) or (34), in which the component feeder includes a feeding checking mechanism for checking whether or not the taped component is fed at the feeding pitch by the feeding mechanism.

According to the aspect, since it is checked whether or not the component is appropriately fed or was fed to the supply position, a feeder having high reliability is realized.

(42) The component feeder according to clause (41), in which the feed holes are provided at a constant hole pitch in the carrier tape, the feeding mechanism is configured to feed the taped component at the feeding pitch by engaging a claw with the feed hole and by moving the claw, and the feeding checking mechanism includes a pin inserted into the feed hole, a pin insertion mechanism which inserts the pin into the feed hole, and the sensor for detecting whether or not the pin is inserted by the pin insertion mechanism.

The aspect is an aspect into which restriction related to the structure of the feeding mechanism and the feeding checking mechanism is added. The aspect is an aspect which is particularly effective in a case where the pitch of the feed hole provided on the carrier tape and the feeding pitch match each other, and according to the aspect, it is possible to simply check whether or not the component is appropriately fed or was fed to the supply position.

(43) The component feeder according to clause (42), in which an operation of the pin insertion mechanism is interlocked with an operation of the feeding mechanism.

According to the aspect, since it is possible to drive the feeding checking mechanism by the driving source of the feeding mechanism, it is possible to reduce the driving source.

(44) The component feeder according to any one of clauses (41) to (43), in which the feeding checking mechanism is provided on a downstream side of the feeding mechanism.

The feeding checking mechanism can also be provided at the same place as the feeding mechanism. However, in a case where the feeding checking mechanism is provided at the same place, a case where the operations of the feeding mechanism and the feeding checking mechanism are interfered is also considered, and in order to avoid the interference, there is a possibility that the structure of the component feeder becomes complicated. In this regard, according to the aspect, while the structure of the component feeder is relatively simple, it is possible to check that the feeding amount of the taped component is appropriate. In addition, even in a case of an aspect in which the pin and the pin insertion mechanism are employed, the feeding mechanism is positioned on the downstream side of the feeding mechanism, and thus, it is also possible to check that the component is appropriately fed to the supply position with respect to the taped component which holds the component to a tail end portion or the vicinity of the tail end portion of the carrier tape. In addition, in a case of the taped component that does not hold the component to the vicinity of the tail end portion, it is also possible to provide the feeding checking mechanism on the upstream side of the feeding mechanism.

DETAILED DESCRIPTION OF THE INVENTION

Hereinafter, a representative embodiment of the invention that can be claimed will be described as an embodiment in detail with reference to the drawings. In addition, the invention that can be claimed can be realized by various aspects to which various changes and improvements are performed based on knowledge of those skilled in the art starting from the aspect described in clauses of the above-described "Aspects of the Invention". In addition, by using the technical contents described in the description of each of the clauses of "Aspects of the Invention", it is also possible to configure various alternative embodiments.

EMBODIMENT

[A] Component Mounting Machine on which Component Feeder is Installed

Figure 1:
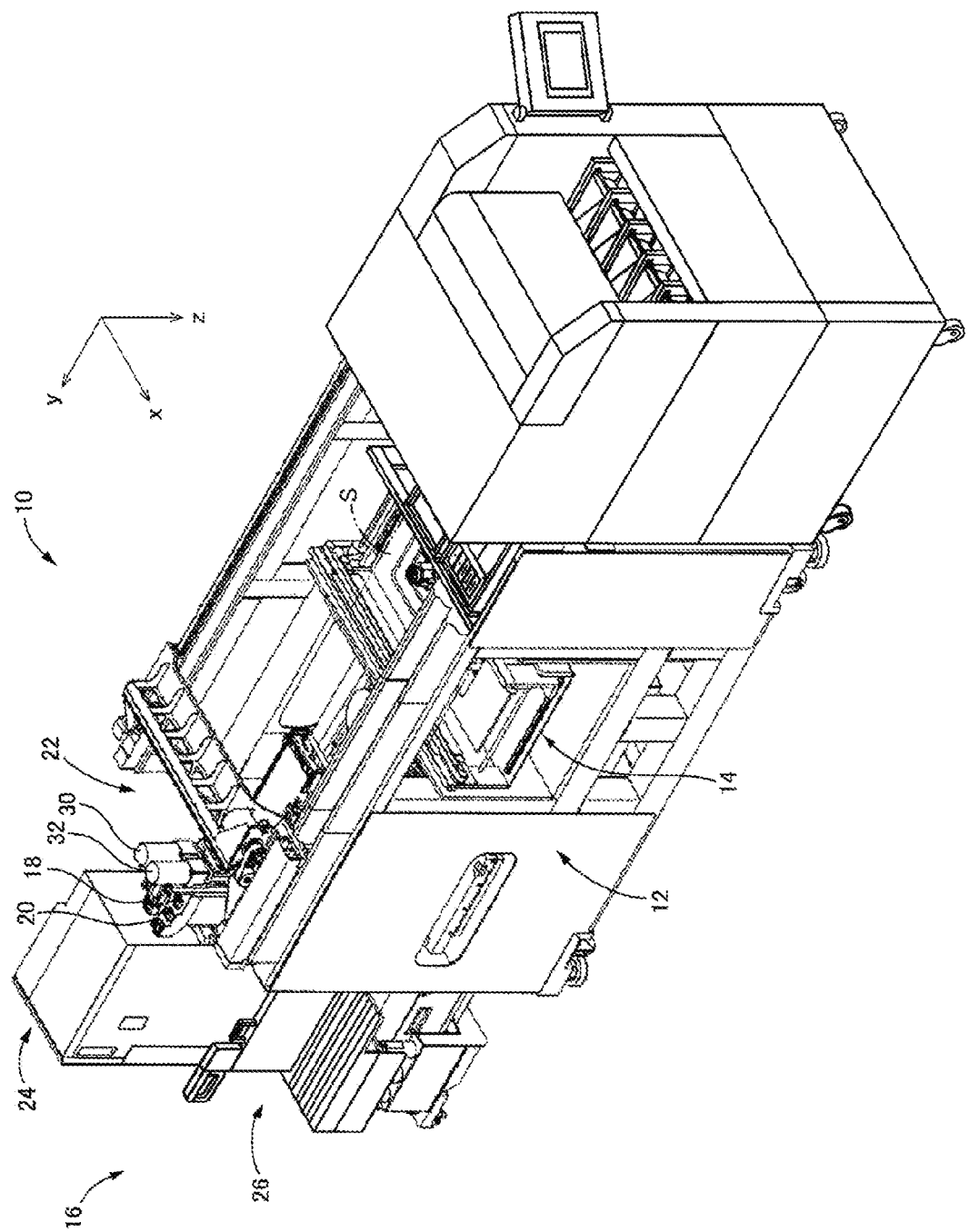
FIG. 1 is a perspective view illustrating a component mounting machine on which a component feeder which is an embodiment that can be claimed is installed.

As illustrated in FIG. 1, a component mounting machine 10 on which a component feeder of the embodiment is installed includes a main body 12, a board conveyance and fixing device 14 which conveys and fixes a board S, a component supply device 16 which supplies a component, such as an electronic component, two mounting heads 18 and 20 for mounting the component on the board S fixed by the board conveyance and fixing device 14 by holding the component supplied from the component supply device 16, and a head moving device 22 which moves the mounting heads 18 and 20 along one plane between the component supply device 16 and the board conveyance and fixing device 14. Incidentally, the head moving device 22 is an XY-robot-type moving device, and moves the mounting heads 18 and 20 in the x-direction and in the y-direction which are illustrated in the drawing.

The component supply device 16 includes a tray-type component supply device 24 which supplies the components aligned in a tray, and a feeder-type component supply device 26 which supplies the component from a taped component. In the drawing, only one feeder-type component supply device 26 is not disposed, but multiple feeder-type component supply devices 26 can be disposed to be aligned. Although will be described in detail later, the feeder-type component supply device 26 illustrated in the drawing is a component feeder of the embodiment, and hereinafter, the feeder-type component supply device 26 will be called a component feeder 26. Incidentally, although will be described in detail later, the component feeder 26 supplies a component having multiple leads, that is, a component with leads.

Figure 2:
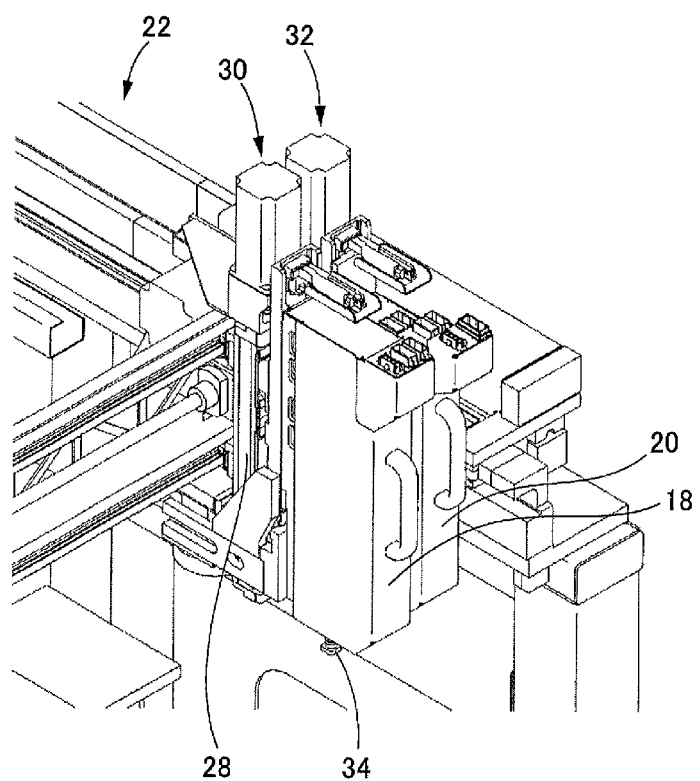
FIG. 2 is a perspective view illustrating a mounting head and a head moving device of the component mounting machine in a point of view reverse to FIG. 1.

As illustrated in FIG. 2, the mounting heads 18 and 20 are attached to one slider 28 via a head lifting and lowering devices 30 and 32 which lift and lower each of the mounting heads 18 and 20, and as the slider 28 is moved by the head moving device 22, the mounting heads 18 and 20 are integrally moved along one plane. Meanwhile, the mounting heads 18 and 20 are independently lifted and lowered by the head lifting and lowering devices 30 and 32. In other words, the head lifting and lowering devices 30 and 32 respectively move the mounting heads 18 and 20 in an up-down direction (z-direction illustrated in FIG. 1).

Figure 3:
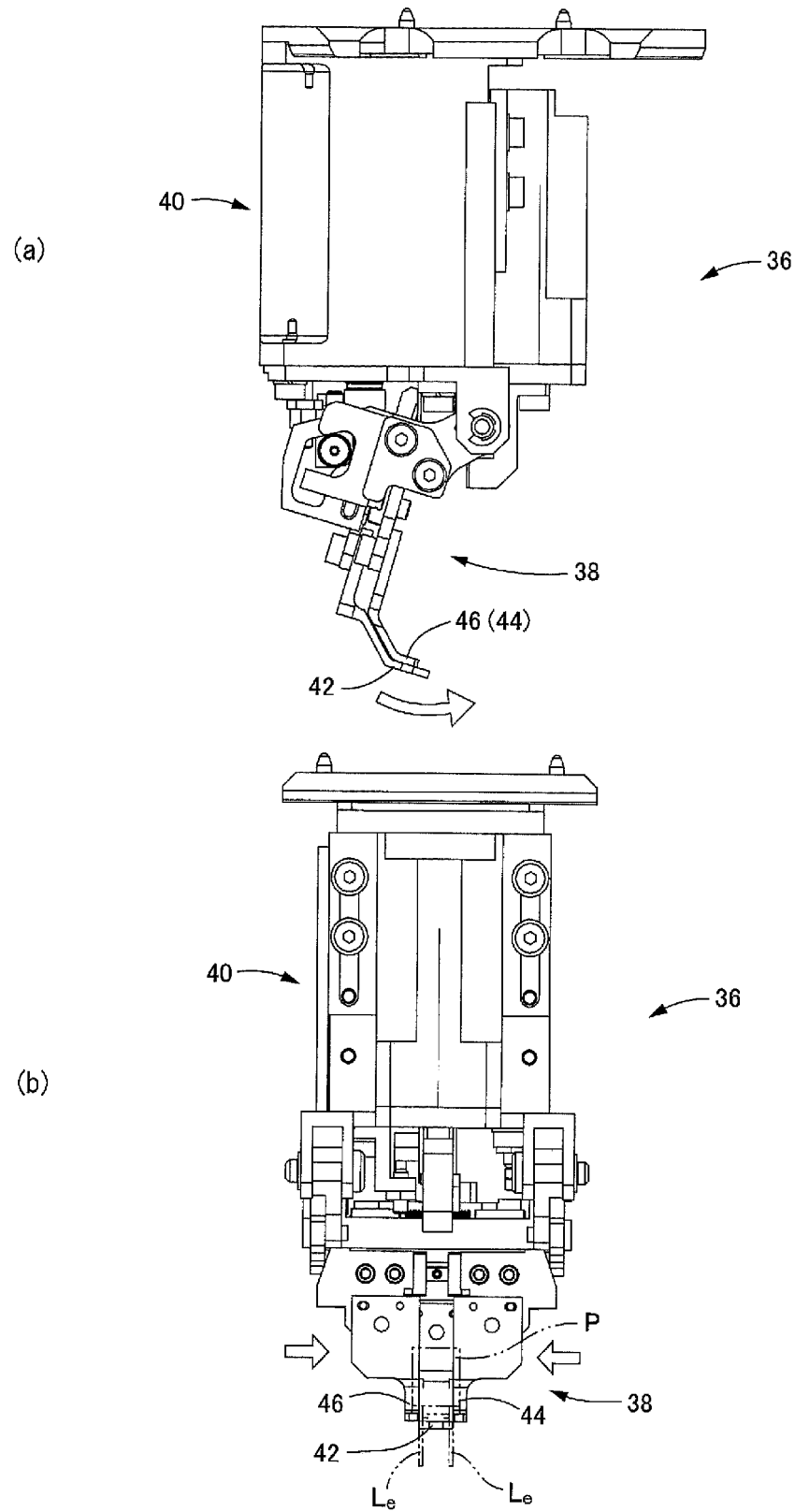
FIG. 3 is a view illustrating a chuck device included in the mounting head.

The mounting head 18 mainly loads the component supplied from the tray-type component supply device 24 onto a surface of the board, and includes a suction nozzle 34 which sucks and holds the component by a negative pressure in a lower portion as a component holding device. Meanwhile, the mounting head 20 is mainly for inserting the component supplied from the component feeder 26, that is, each of the multiple leads included in the component, into a hole provided in the board, and a chuck device 36 illustrated in FIG. 3 is provided in the lower portion thereof. Incidentally, FIG. 3(a) is a view illustrating the chuck device 36 from a y-direction illustrated in FIG. 1, and FIG. 3(b) is a view when the chuck device 36 is viewed from x-direction.

Figure 4:
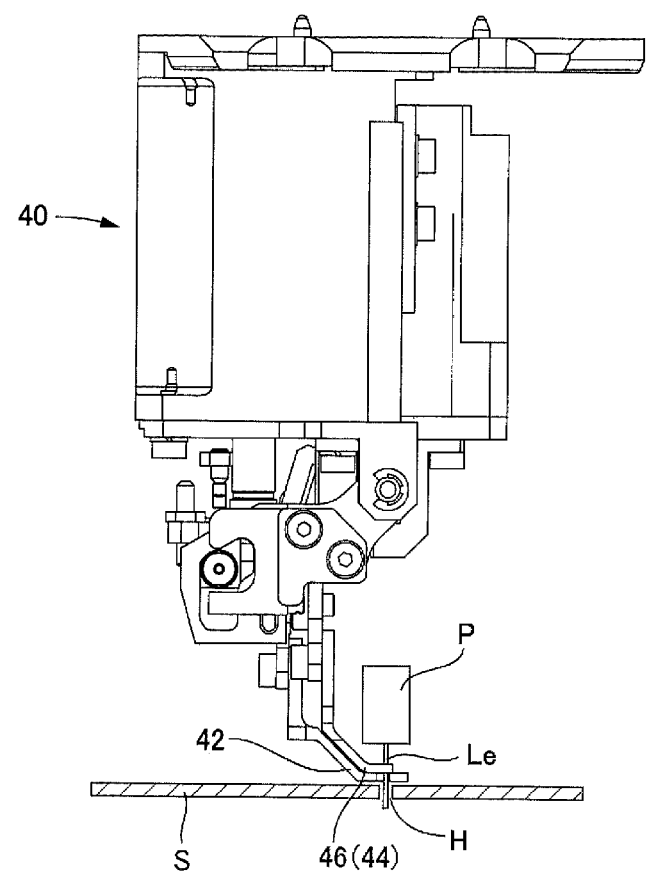
FIG. 4 is a view illustrating an aspect in which a component that holds a lead is mounted on a board by a chuck included in the chuck device.

The chuck device 36 is configured to include a chuck 38 and a chuck driving device 40, and the chuck 38 is configured to include a fixed claw 42, and an opening and closing claws 44 and 46 provided on both sides of the fixed claw 42. Although the detailed description of the operation is omitted, the chuck driving device 40 oscillates the chuck 38 in a direction illustrated by an outlined arrow in FIG. 3(a). The chuck 38 is configured such that the opening and closing claws 44 and 46 are closed in accordance with the oscillation. A component with leads P (hereinafter, simply, there is a case of being called "component P") including two leads Le is supplied from the component feeder 26, and as illustrated in FIG. 3(b), the chuck 38 is configured to respectively pinch one of the two leads Le between the opening and closing claw 44 and the fixed claw 42, and another one lead Le between the opening and closing claw 46 and the fixed claw 42, in a state of being closed. In addition, as illustrated in FIG. 4, the component P held by the chuck 38 is mounted on the board S as the leads Le included in the component P is inserted into a hole H provided on the board S.

[B] Taped Component Handled by Component Feeder

Figure 5:
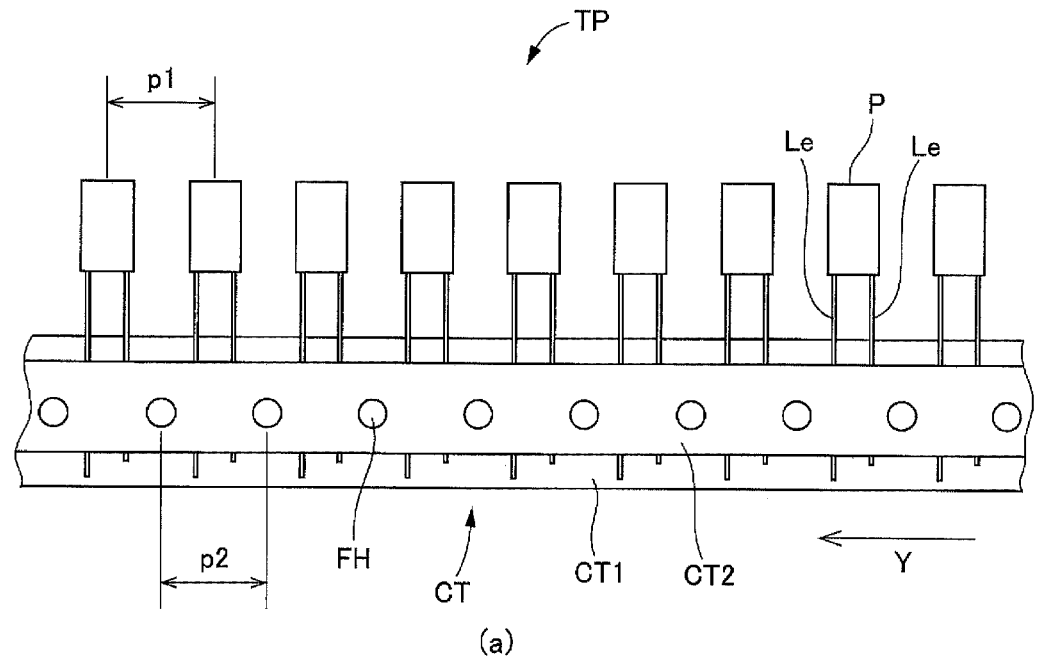
FIG. 5 is a view illustrating a taped component handled by the component feeder.
Figure 5:
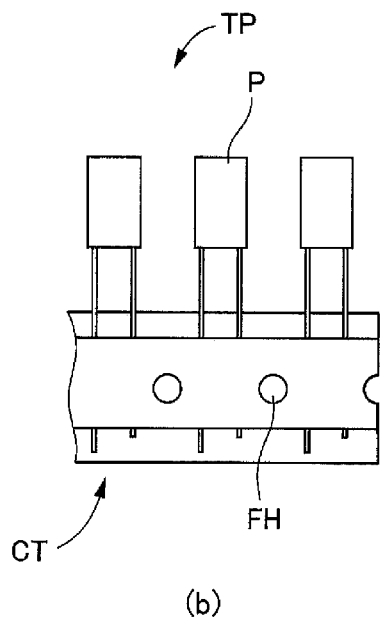
Figure 5:
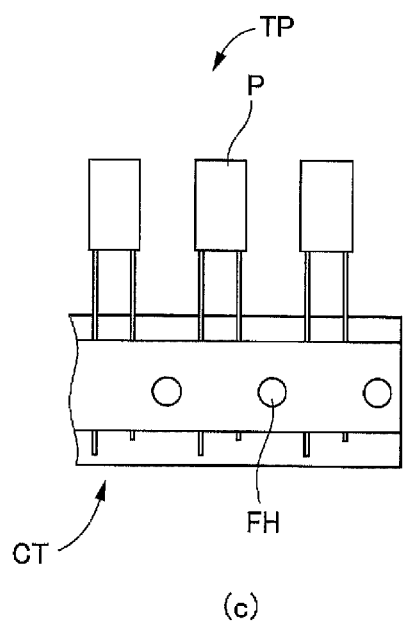

In the taped component handled by the component feeder 26, for example, the component P, such as the electronic component, is held at a predetermined disposition pitch p1 on a carrier tape CT as illustrated in FIG. 5(a), and in a taped component TP illustrated in FIG. 5(a), the component with leads P, such as an electrolytic capacitor, and the multiple leads Le (specifically, two leads Le) included in the component P are held on the carrier tape CT. In addition, the component P is a component in which the two leads Le extend in parallel in the same direction, and can be called a component with radial leads. The carrier tape CT is configured of a relatively thick main tape CT1 and an adhesive sticking tape CT2 stuck thereto, and the lead Le is held to be interposed therebetween.

In the carrier tape CT, feed holes FH are punched at a predetermined hole pitch p2. The hole pitch p2 is equal to the disposition pitch p1 of the component P, and each of the feed holes FH is provided in the middle of the component P in a longitudinal direction of the carrier tape CT. The feed holes FH is used in feeding the taped component TP by the component feeder 26. In addition, in the component feeder 26, the taped component TP is fed in a predetermined feeding direction, that is, in the Y-direction illustrated in the drawing.

[C] Component Feeder i) Outline of Component Feeder

Figure 6:
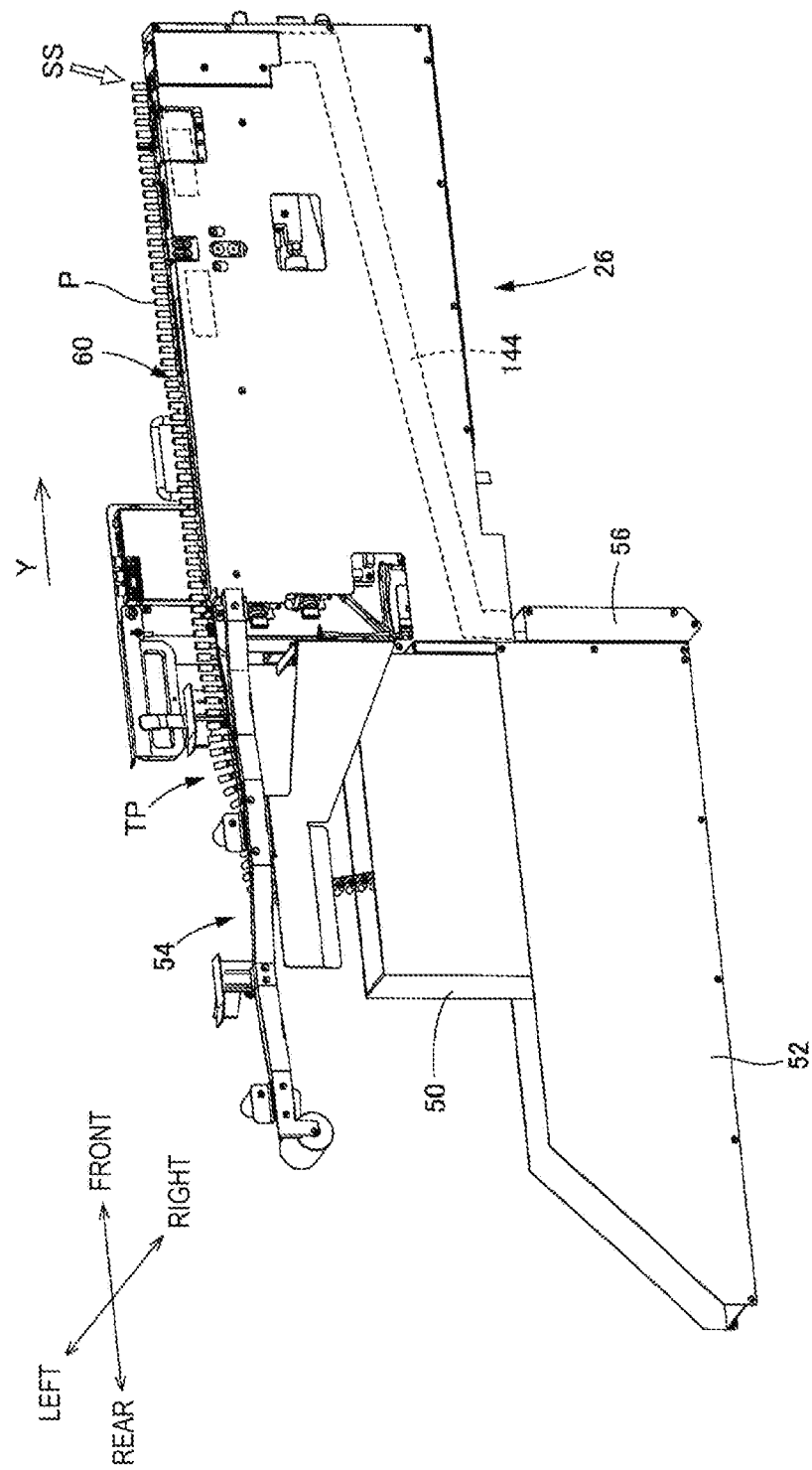
FIG. 6 is a perspective view illustrating the entire component feeder.

As illustrated in FIG. 6, the component feeder 26 of a schematic embodiment of the component feeder is disposed in the component supply device 16 of the component mounting machine 10 in a state where a box holder 52 which holds a component accommodation box 50 in which the taped component TP is accommodated, a tape guide 54 which guides the taped component TP in the component accommodation box 50 held by the box holder 52 to the component feeder 26, and a waste tape collection box 56 which accommodates the cut carrier tape CT (which will be described later), are attached.

In the upper portion of the component feeder 26, a guide groove 60 which extends in the longitudinal direction is provided, and the taped components TP guided by the tape guide 54 are intermittently fed a predetermined feeding pitch p3 by a predetermined feeding pitch p3 from a tail end side to a front end side in the longitudinal direction of the component feeder 26 through the guide groove 60. In other words, the Y-direction illustrated in the drawing is the feeding direction. Incidentally, in the description above, regarding the direction related to the component feeder 26, a right part is called a front part and a left part is called a rear part in FIG. 6, and the left part and the right part in a case of being seen in the feeding direction of the taped component TP are respectively called the left part and the right part.

Figure 7:
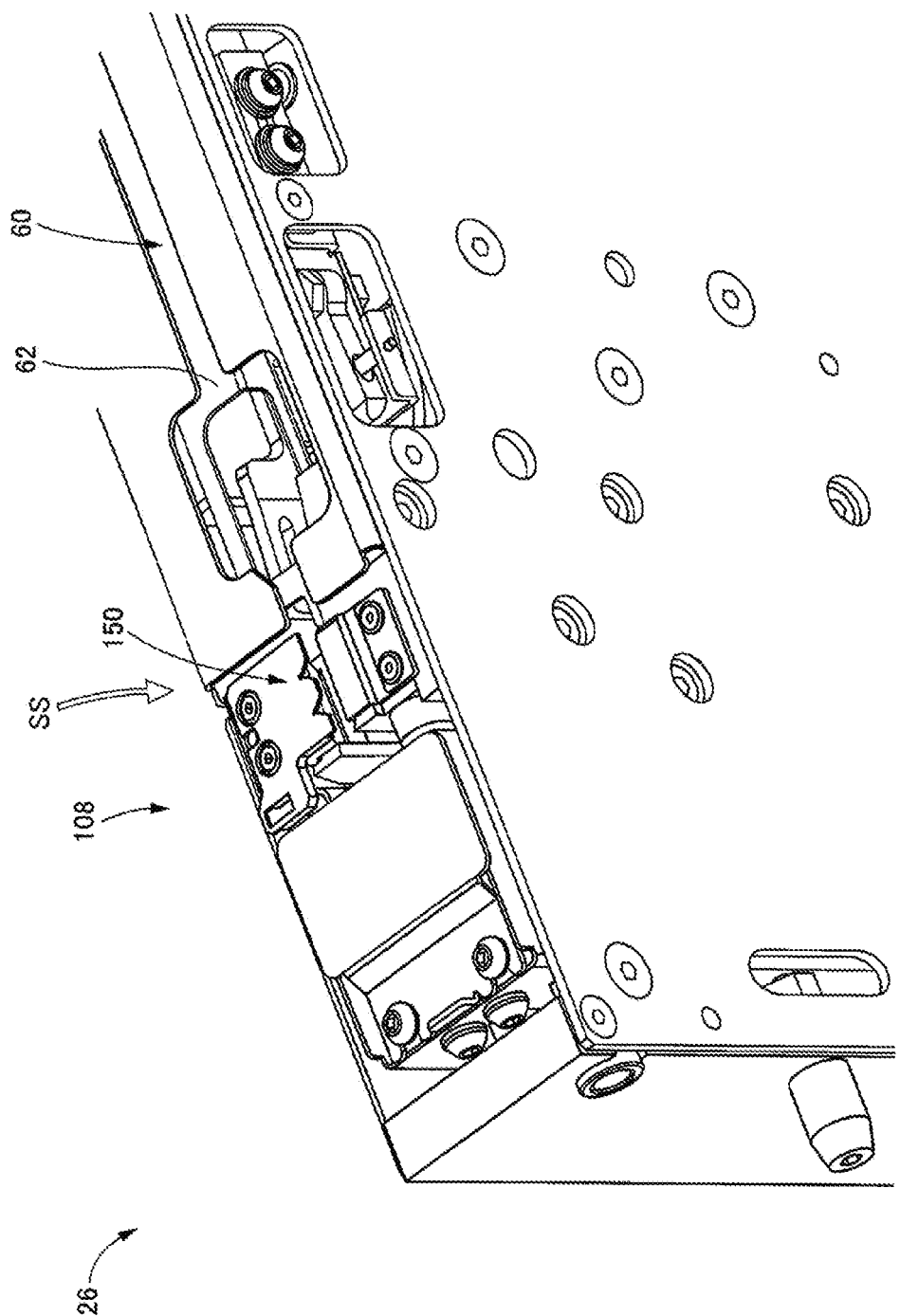
FIG. 7 is a perspective view illustrating a position to which the component is supplied in the component feeder.

In the drawing, the position at which the component P that exits on the most front side is a supply position SS set in the component feeder 26, and the component P is supplied at the position. In other words, the component P positioned at the supply position SS is held by the mounting head 20 including the chuck device 36 described above, and is mounted on the board S. Incidentally, a view in which a part at which the supply position SS exists is illustrated when viewed from obliquely right front upper part, is illustrated in FIG. 7.

ii) Feeding Mechanism

Figure 8:
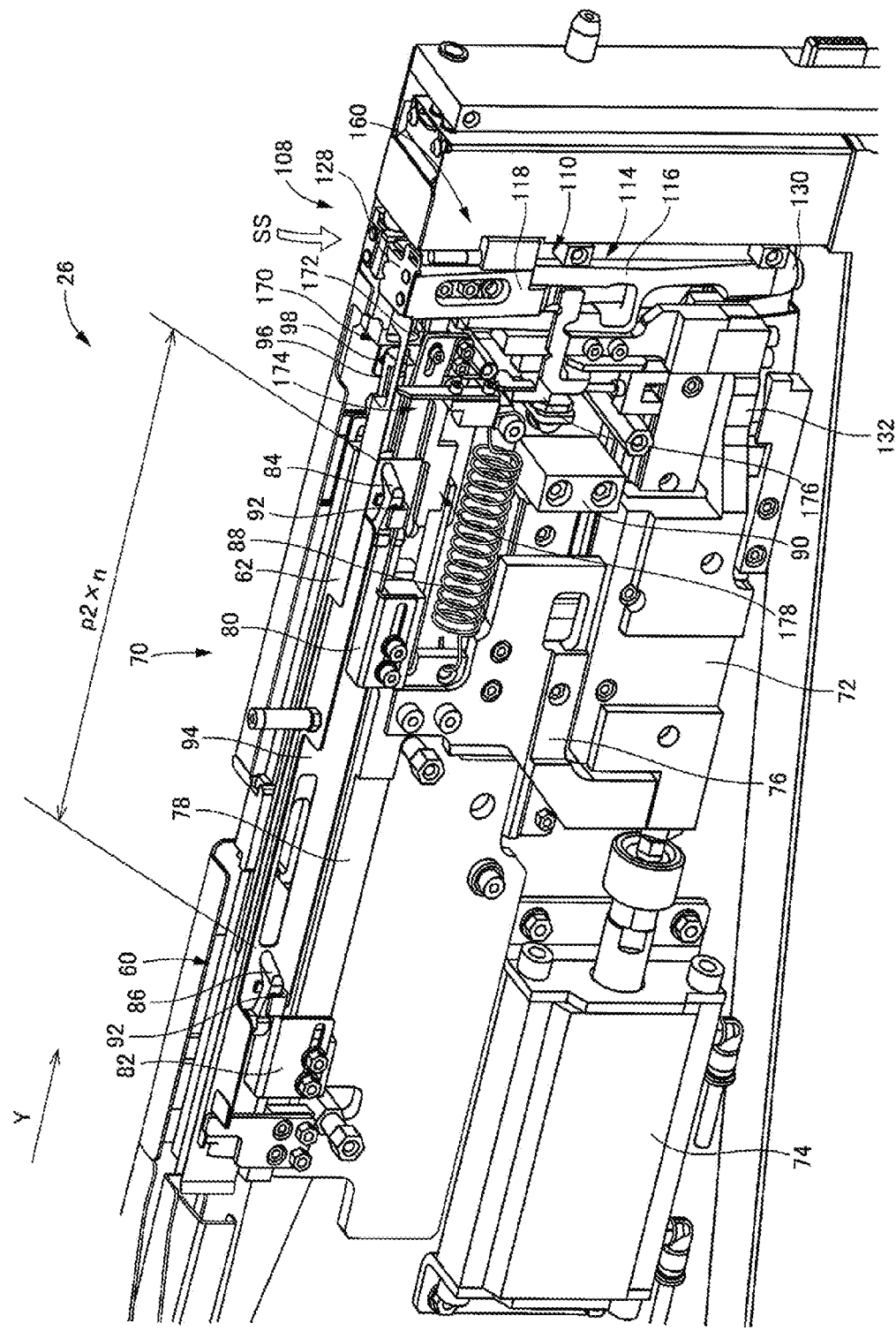
FIG. 8 is a perspective view schematically illustrating the entire internal structure of the component feeder.

In the description with reference to FIG. 8 in which a state where an exterior cover is removed is illustrated, the taped component TP is held by a guide rail 62 provided in the guide groove 60. In the guide rail 62, a lower portion is folded and bent in a U shape to a left side, and an upper portion is bent to a right side and has a part that serves as a flange. In the drawing, although the taped component TP is not illustrated, the taped component TP is held on the left side of the guide rail 62 in a state where the lower portion is in the U-shaped part. The component feeder 26 includes a feeding mechanism 70 which feeds the taped component TP in this state forward.

The feeding mechanism 70 is configured to include a first slide 72 which is supported to be movable in a front-rear direction in a feeder main body, a double-acting air cylinder 74 which is an actuator that allows the first slide 72 to reciprocate in the front-rear direction, a second slide 76 which is supported by the feeder main body and reciprocates in the front-rear direction in accordance with the operation of the first slide 72, a support bar 78 which is operated integrally with the second slide 76, and a feeding claw 84 and a feeding claw 86 which are supported to be rotatable around the support bar 78 via a bracket 80 and a bracket 82.

In a case of moving the first slide 72 forward by the air cylinder 74, the second slide 76 moves forward in a state of abutting against the first slide 72 by a spring 88 which is a tensile coil spring that passes across between the feeder main body and the second slide 76 (specifically, the support bar 78). When a stopper 90 is established in the feeder main body and moves by a certain distance, the second slide 76 is locked to the stopper 90 and the forward movement thereof is stopped. In this state, only the forward movement of the first slide 72 is allowed. When the first slide 72 returns to the rear part by the air cylinder 74, at a certain position, the first slide 72 abuts against the second slide 76 locked to the stopper 90, and after this, the second slide 76 moves rearward together with the first slide 72.

Base end sections of the feeding claw 84 and the feeding claw 86 are respectively supported to be rotatable by the bracket 80 and the bracket 82 which are fixed to the support bar 78, and are rotatable in a horizontal plane. Distal ends of the feeding claw 84 and the feeding claw 86 are oriented toward the left side. Between each of the brackets 80 and 82 and each of the feeding claws 84 and 86, a spring 92 which is a compression coil spring is installed, and each of the feeding claws 84 and 86 is biased in a direction in which the distal end is oriented toward the left side.

Between the guide rail 62 and the support bar 78, in a posture of extending forward and rearward, a locking plate 94 is installed. In a state illustrated in the drawing, that is, in a state where the support bar 78 is positioned at the rear part, and in other words, in a case where the second slide 76 is positioned at the tail end of a movement range, tail ends of each of the feeding claw 84 and the feeding claw 86 abut against the locking plate 94 by the biasing force of the spring 92.

Figure 9:
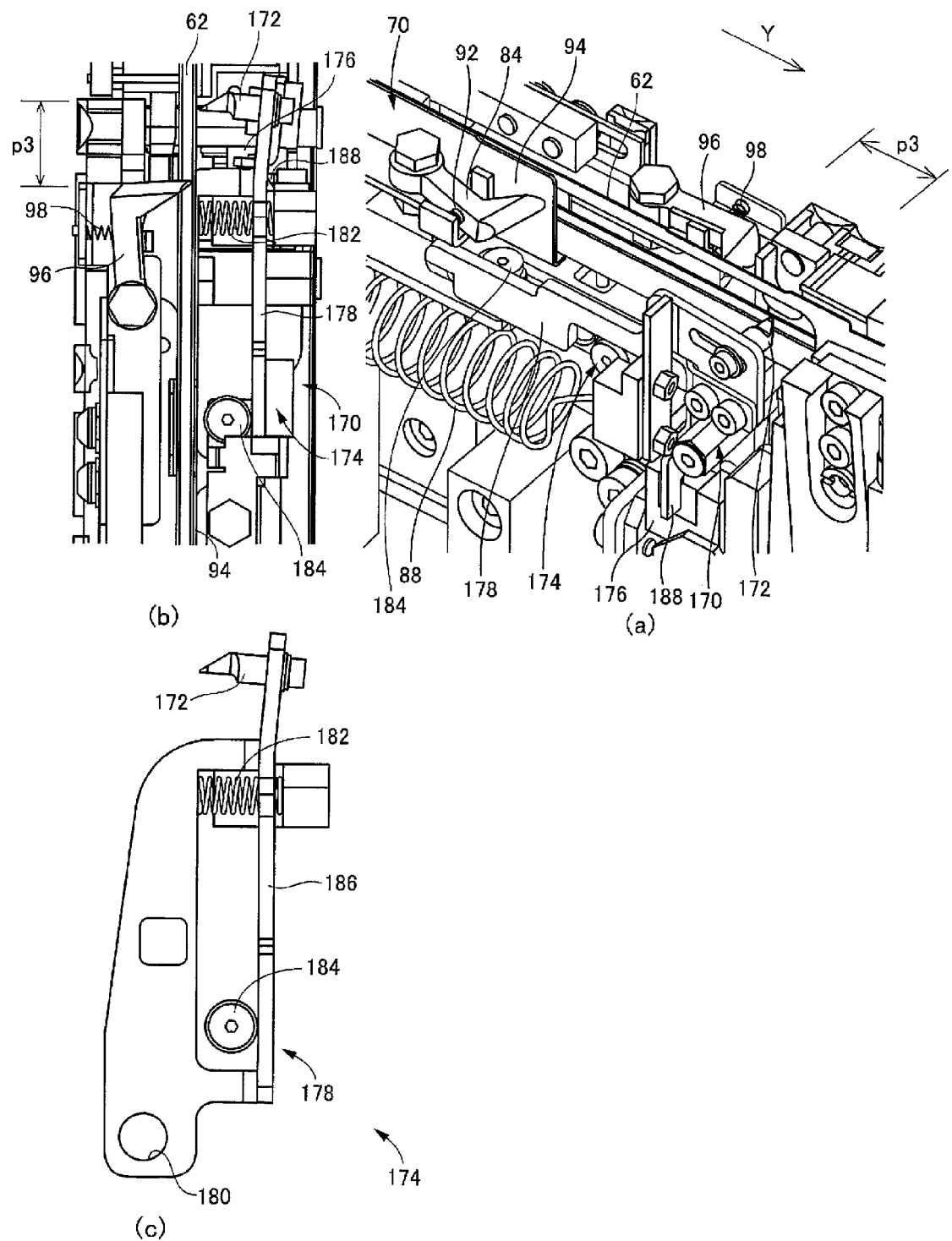
FIG. 9 is a view illustrating a part of a feeding mechanism included in the component feeder, and a feeding checking mechanism for checking a feeding amount by the feeding mechanism, in a certain state.
Figure 10:
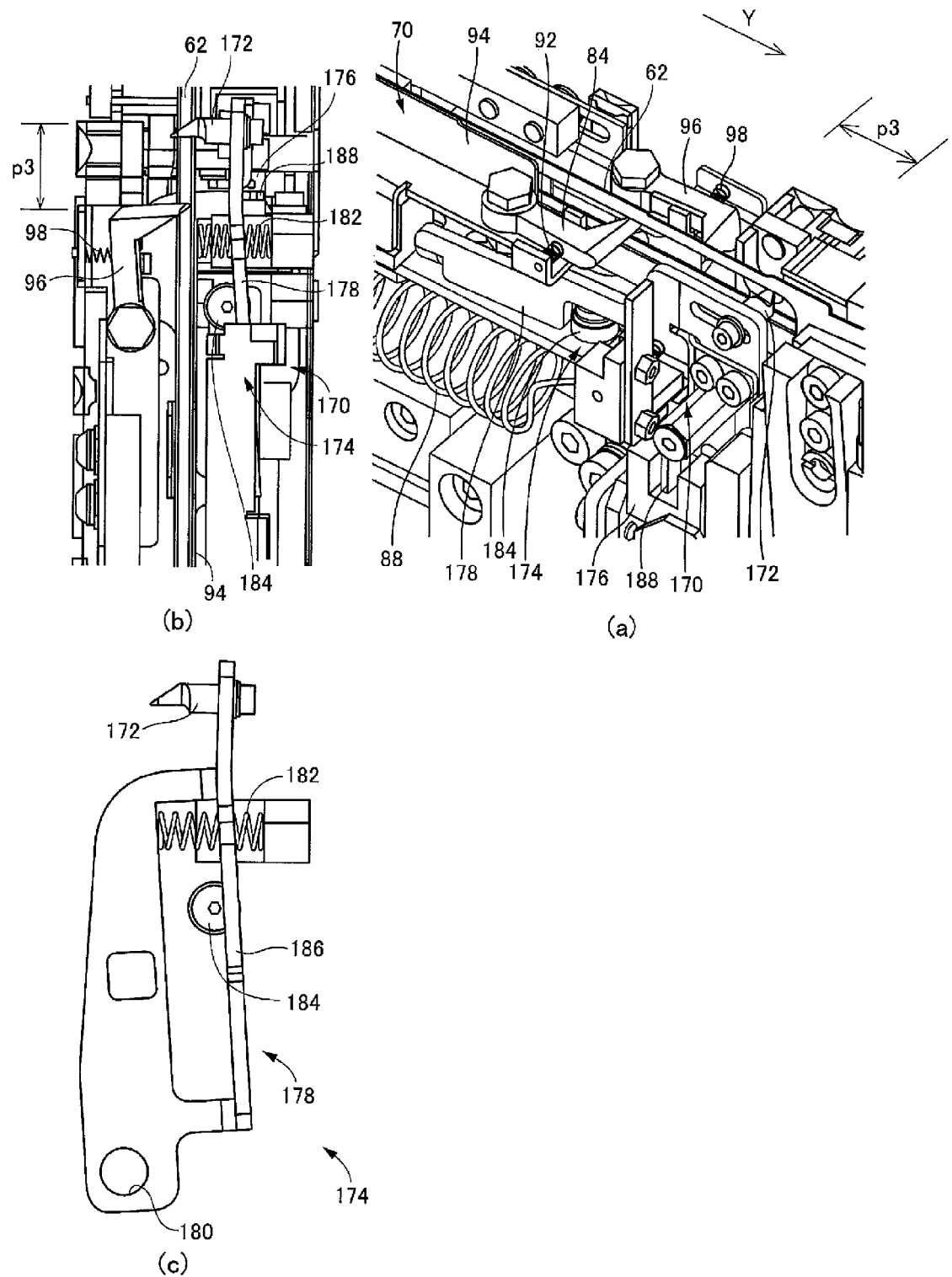
FIG. 10 is a view illustrating a part of the feeding mechanism included in the component feeder, and the feeding checking mechanism for checking the feeding amount by the feeding mechanism, in a state different from that of FIG. 9.

With reference to FIGS. 9(*a*) and 10(*a*) in which a part at which the feeding claw 84 is installed is enlarged and illustrated, in a state where the support bar 78 is positioned at the rear part, as illustrated in FIG. 9(*a*), a distal end of the feeding claw 84 abuts against the locking plate 94. Meanwhile, when the second slide 76 advances and the support bar 78 advances, the feeding claw 84 also advances, and as illustrated in FIG. 10(*a*), the distal end of the feeding claw 84 protrudes from the end of the locking plate 94, and the feeding claw 84 is rotated to the position that protrudes from the opening of the guide rail 62 by the biasing force of the spring 92. Although not illustrated, by the advancing of the support bar 78, the feeding claw 86 is also similarly operated, the distal end of the feeding claw 86 protrudes from a long hole provided in the locking plate 94, and the feeding claw 86 is rotated to the position that protrudes from the opening of the guide rail 62 by the biasing force of the spring 92.

An interval between the distal end of the feeding claw 84 and the distal end of the feeding claw 86 is an integral multiple (p2×n) of the hole pitch p2 of the feed hole FH provided in the taped component TP, and when the locked state by the locking plate 94 is released, the distal ends of each of the feeding claw 84 and the feeding claw 86 are inserted into different feed holes FH at the same time. As the supporting plate 78 further advances after the insertion, the taped component TP is fed only by the advancing amount. The further advancing amount is adjusted to an amount which is equal to the hole pitch p2.

As can be ascertained from FIGS. 9(*a*) and 10(*a*), and FIGS. 9(*b*) and 10(*b*) (the feeding claw 84 is omitted) which are viewed from above, on a side opposite to the feeding claw 84 and the feeding claw 86 of the guide rail 62, that is, on the left side of the taped component TP, a non-return claw 96 is installed to be rotatable. When the front side is called a downstream side in the feeding direction of the taped component TP, and the rear side is called an upstream side, the non-return claw 96 is provided on the downstream side of the feeding claw 84. The non-return claw 96 is biased in the right direction by a force of a spring 98 which is a compression coil spring, and when the taped component TP is fed only by the above-described advancing amount, the non-return claw 96 is inserted into the feed hole FH. In a case where the non-return claw 96 is inserted into the feed hole FH, the displacement to the upstream side of the taped component TP is prohibited. In addition, in the non-return claw 96, a surface on the upstream side at the distal end is an inclined surface, and the non-return claw 96 is disengaged from the feed hole FH against the biasing force of the spring 98 by the feeding force when feeding the taped component TP to the downstream side even in a state of being inserted into the feed hole FH.

In a state where the non-return claw 96 is inserted into the feed hole FH, by allowing the first slide 72 to retreat, while the taped component TP maintains the position, the feeding claw 84 and the feeding claw 86 also retreat. As can be ascertained from the operation described above, the feeding mechanism 70 is configured to engage the feeding claw 84 and the feeding claw 86 with the feed hole FH, and to feed the taped component TP in the feeding direction by moving the feeding claw 84 and the feeding claw 86, and to feed the taped component TP to the downstream side only by the feeding pitch p3 which is equal to the hole pitch p2 and the above-described disposition pitch p1 by one time of advancing and retreating operation of the air cylinder 74.

iii) Positioning Mechanism and Lead Cutting Mechanism

Figure 11:
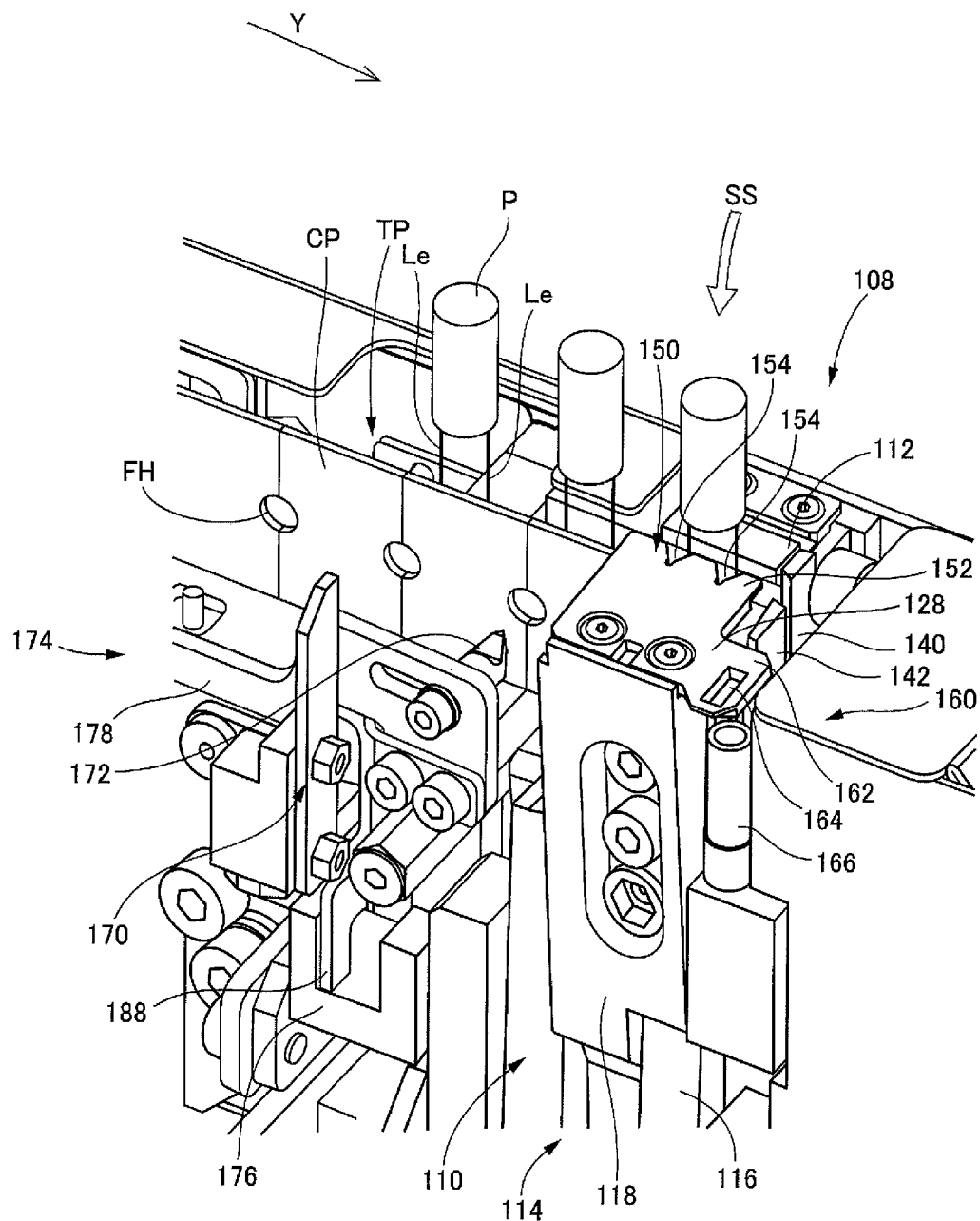
FIG. 11 is a perspective view illustrating a positioning mechanism included in the component feeder.

The component feeder 26 includes a mechanism for positioning the component P at the above-described supply position SS as illustrated in FIGS. 7 and 8, that is, a positioning mechanism 108 for positioning the component P in each of the feeding directions of the two leads Le included in the component P as illustrated in FIG. 11. In addition, in the positioning mechanism 108, a mechanism for cutting a spare part of the two leads Le of the component P positioned at the supply position SS is integrated.

With reference to FIGS. 7, 8, 11, and 12, more specifically, the positioning mechanism 108 generally configures a clamp 110 which includes a first member and a second member which are two members that perform operations relative to each other, and performs an opening and closing action, as a main constituent element. Specifically, the clamp 110 is configured to include a fixing block 112 fixed to the feeder main body, and a lever 114 held to be oscillatable in the feeder main body. Incidentally, the lever 114 functions as one of the first member and the second member, and the fixing block 112 functions as the other one of the first member and the second member.

The lever 114 is configured to include a main lever 116 of which an upper end portion branches into two, and a sub-lever 118 which intersects with the main lever 116, and the main lever 116 and the sub-lever 118 are oscillatable around a common shaft 120. As can be ascertained from FIG. 12(*a*), in the main lever 116, an upper end portion is biased to a right part by a biasing force of a spring 122 which is a compression coil spring, and in the sub-lever 118, a lower end portion is biased to a right part by the biasing force of a spring 124 which is a compression coil spring.

A blade 126 is attached to the upper end of the main lever 116, and a pinching plate 128 is attached to an upper end of the sub-lever 118. A roller 130 is attached to the lower end portion of the main lever 116, and as illustrated in FIG. 8, the roller 130 functions as a cam follower, and in a case where the first slide 72 advances, the roller 130 is engaged with a cam surface 132 provided in the front end portion of the first slide 72.

Figure 12:
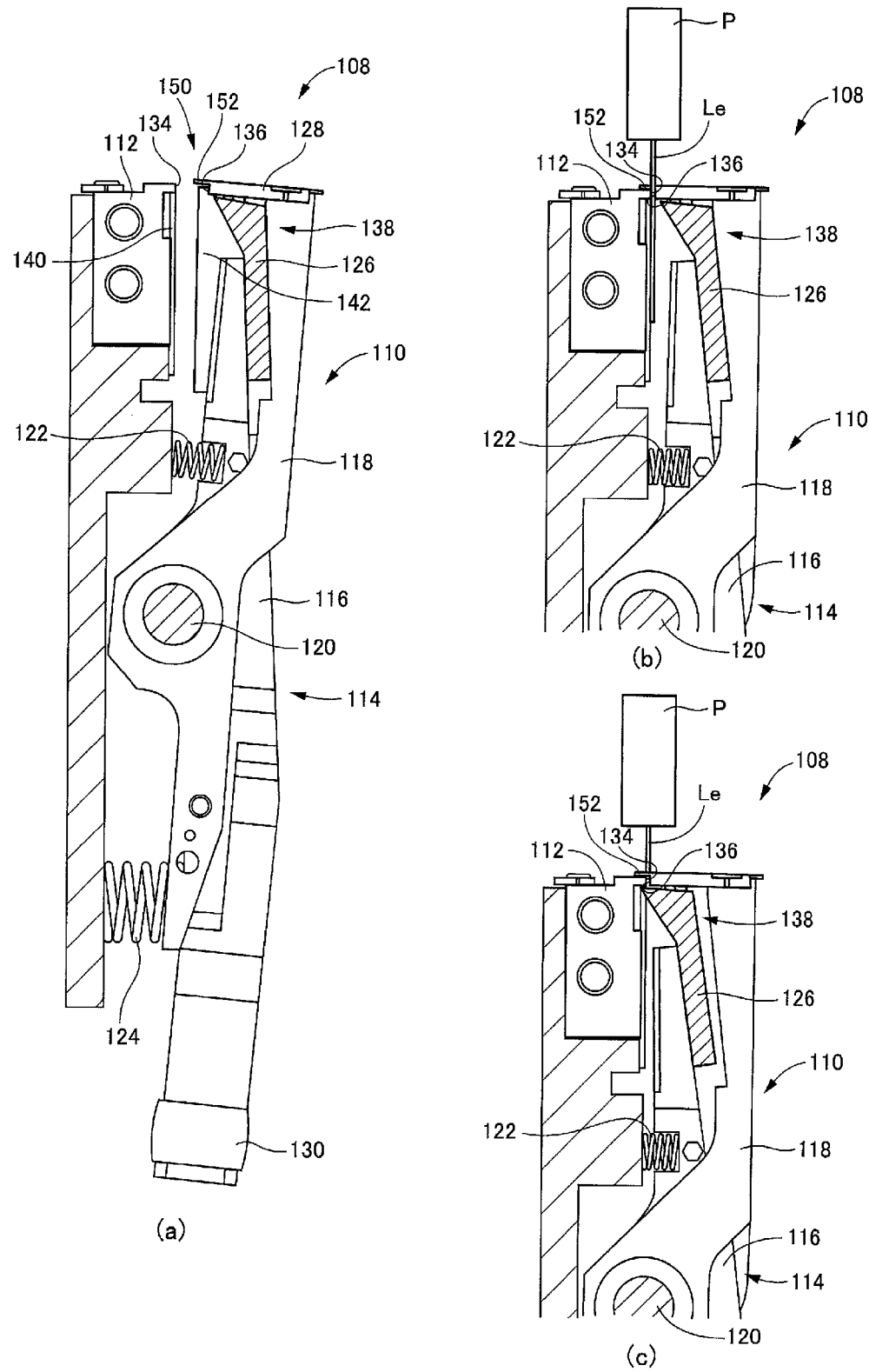
FIG. 12 is a sectional view of a clamp that configures the positioning mechanism.

The biasing force by the spring 122 is greater than the biasing force by the spring 124, and in a state illustrated in FIG. 12(*a*), the sub-lever 118 abuts against the rear surface of the blade 126, and a state where the upper ends of each of the main lever 116 and the sub-lever 118 are positioned at the right part, that is, a state where the clamp 110 is open, is achieved. In this state, both of the blade 126 and the pinching plate 128 are disengaged from the fixing block 112.

When the first slide 72 advances, an upper end of the main lever 116 oscillates in a direction toward the left part, and according to this, the sub-lever 118 also oscillates in the same direction. When the main lever 116 and the sub-lever 118 oscillate to a certain degree, as illustrated in FIG. 12(*b*), in a state where the lead Le of the component P is interposed between a pinching surface 134 provided in the fixing block 112 and a pinching surface 136 provided in the pinching plate 128, oscillation of the sub-lever 118 is stopped. A part at which the pinching surface 134 of the fixing block 112 is provided and a part at which the pinching surface 136 of the pinching plate 128 is provided, respectively function as pinching sections, and the lead Le of the component P is pinched by the pinching sections. In this state, the lead Le is pinched by a force caused by a biasing force of the spring 124.

Furthermore, when the main lever 116 oscillates, as illustrated in FIG. 12(c), the lead Le is cut by the distal end of the blade 126 and the lower end of the pinching surface 134 of the fixing block 112. The distal end of the blade 126 and the lower end of the pinching surface 134 of the fixing block 112 function as one pair of blades which are respectively provided in the above-described first member and the second member, and by the one pair of blades, the lead Le is cut on the distal end side (lower end side) of the part pinched by the above-described pinching section. In other words, the component feeder 26 includes a lead cutting mechanism 138 which cuts the lead Le by the opening and closing action of the clamp configured to include one pair of blades, at the supply position SS.

The component of which the lead Le is cut at the supply position SS is held by the chuck device 36 of the mounting head 20 described above in a state where the lead Le is held by the clamp 110, and is supplied to be mounted on the board S moved by the mounting head 20 after the clamp 110 is open. The opening operation of the clamp 110 is performed by using the biasing force of the spring 122 and the spring 124 as the first slide 72 retreats. Since the operation between an open position illustrated in FIG. 12(a) and a closed position illustrated in FIG. 12(b), that is, the opening and closing action of the clamp 110, is performed in accordance with the advancing and retreating operation of the first slide 72, the operation is interlocked with the operation of the feeding mechanism 70 described above.

In addition, as illustrated in FIG. 11, on the end face on the front side of the fixing block 112 and on the end face on the front side of the main lever 116, a blade 140 and a blade 142 for cutting the carrier tape CT are respectively provided, and by the opening and closing action of the clamp 110, a part of the carrier tape CT which remains after the component P is supplied has already been cut. Apart of the cut carrier tape CT is collected by the waste tape collection box 56 through a collection road 144 (refer to FIG. 6).

In the positioning mechanism 108, it is important that each of the two leads Le included in the component P is positioned at an appropriate position in the feeding direction of the taped component TP. Therefore, at the upper end of the lever 114 which is one of the first member and the second member, specifically, in the pinching plate 128 attached to the upper end of the sub-lever 118, a guide section 150 is provided.

The pinching plate 128 includes a thin piece-like protrusion piece section 152 which protrudes from the pinching surface 136. In the protrusion piece section 152, corresponding to the two leads Le, two V notches 154 and 154 which are respectively open toward the fixing block 112 which is the other one of the first member and the second member in a case where the clamp 110 is at a closed position, are formed. When the clamp 110 is closed, the protrusion piece section 152 moves to cover the fixing block 112, and by the V notches 154 and 154, the two leads Le are guided to a defined position, that is, the position that is a bottom of the V notches 154 and 154. In this manner, the guide section 150 is configured to include the multiple V notches 154 that correspond to the number of leads Le of the component P.

According to the type of the component P, the number of the leads Le, the diameter of the lead Le, the position of the lead Le, the interval between the leads Le, or the like is various, and according to the component P to be supplied, it is necessary to change the number, the shape, the interval or the like of the V notches 154. For example, it is also considered that a positioning mechanism 156 illustrated in FIG. 13(a), that is, a positioning mechanism configured to integrate the main body section (pinching section) of the above-described pinching plate 128 with the sub-lever 118, and to exchange only a thin guide plate 158 (guide section) that configures the protrusion piece section 152 depending on the component P, is employed. FIG. 13(a) illustrates a state where the lead Le of the component P is normally pinched, but in such a configuration, there is a possibility that a defect illustrated in FIGS. 13(b) and 13(c) which is schematically illustrated when viewed from side face, is generated. Specifically, because of a case where the feeding amount of the taped component TP by the feeding mechanism 70 is not appropriate, or a case where any of the leads Le is bent, it is predicted that any of the leads Le is not positioned at an appropriate position, that is, that any of the leads Le is not in the opening of the corresponding V notch 154. In this case, when closing the clamp 110, the lead Le abuts against the part at which the V notch 154 of the guide plate 158 is not formed, the distal end portion of the guide plate 158 itself is deformed to be lifted up while folding and bending the lead Le, and there is a possibility that the clamp 110 reaches the appropriate closed position. Incidentally, in a case where the diameter of the lead Le is narrow, the possibility is particularly increases.

In order to avoid the above-described situation, in the component feeder 26, the pinching plate 128 is made in a state where the main body section thereof and the protrusion piece section 152 are integrated with each other, and specifically, the main body section and the protrusion piece section 152 are formed by one member, and are exchanged depending on the component P for each pinching plate 128. In order to employ such a configuration, that is, in order to employ a configuration in which rigidity of the protrusion piece section 152 is relatively high, in the component feeder 26, in a case where the situation in which the lead Le is not positioned at an appropriate position, the clamp 110 is not closed to the extent that the closed position of the clamp 110 becomes the appropriate position. Therefore, by checking whether or not the closed position of the clamp 110 is an appropriate position, it is possible to easily check whether or not the position of the lead Le is an appropriate position.

iv) Clamp Closed Position Checking Mechanism

From the above-described point of view, in the component feeder 26, a clamp closed position checking mechanism 160 for checking whether or not the closed position of the clamp 110, that is, the operation position in a state where the clamp 110 is closed is an appropriate position when pinching the lead Le of the component P by the clamp 110 at the supply position SS, is provided.

Specifically, as illustrated in FIG. 11, in the pinching plate 128, an overhang section 162 which overhangs from the sub-lever 118 forward is provided, a detection target hole 164 is formed to penetrate the overhang section 162, the detection target hole 164 is detected by a light reflection-type sensor 166 installed therebelow, and according to whether or not the detection target hole 164 is detected by the sensor 166, it is possible to check whether or not the closed position of the clamp 110 is an appropriate position. In other words, in the component feeder 26, the clamp closed position checking mechanism 160 is configured including the detection target hole 164 that serves as the detection target section provided in the guide section which is a part of the pinching plate 128, and the sensor 166 which considers the detection target hole 164 as a target of detection.

Specifically, a state where the clamp 110 is sufficiently closed is a state where the closed position of the clamp 110 is an appropriate position, and in this state, the light from the sensor 166 is reflected by a part at which the detection target hole 164 does not exist, and the light is detected by the sensor 166. At this time, the detection target hole 164 is not detected, and it is determined that the closed position of the clamp 110 is an appropriate position. Meanwhile, in a state where the closed position of the clamp 110 is not an appropriate position, that is, in a case where the clamp 110 is closed, the light from the sensor 166 penetrates the detection target hole 164, and the light is not detected by the sensor 166. At this time, the detection target hole 164 is detected, and it is determined that the closed position of the clamp 110 is not an appropriate position. In addition, in a case where it is determined that the closed position of the clamp 110 is not an appropriate position, the operation of the component feeder 26 and the operation of the component mounting machine 10 are stopped.

Figure 14:
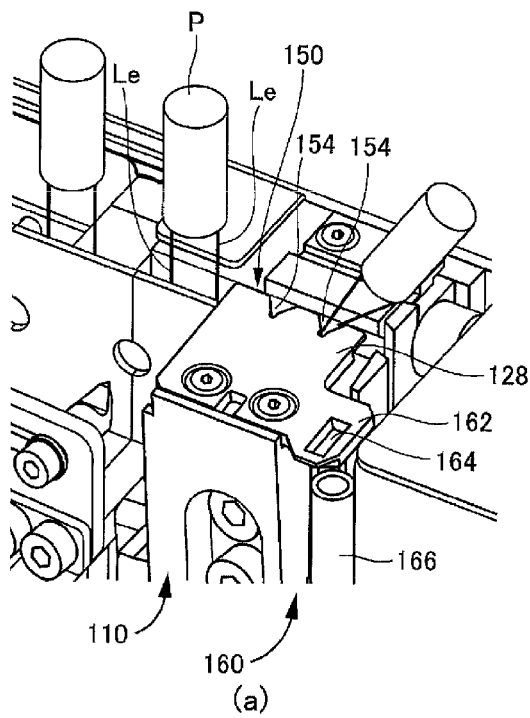
FIG. 14 is a perspective view illustrating an aspect in which the component of which the lead is bent is positioned, and a schematic plan view illustrating a state where the lead is guided to a defined position by a guide section.
Figure 14:
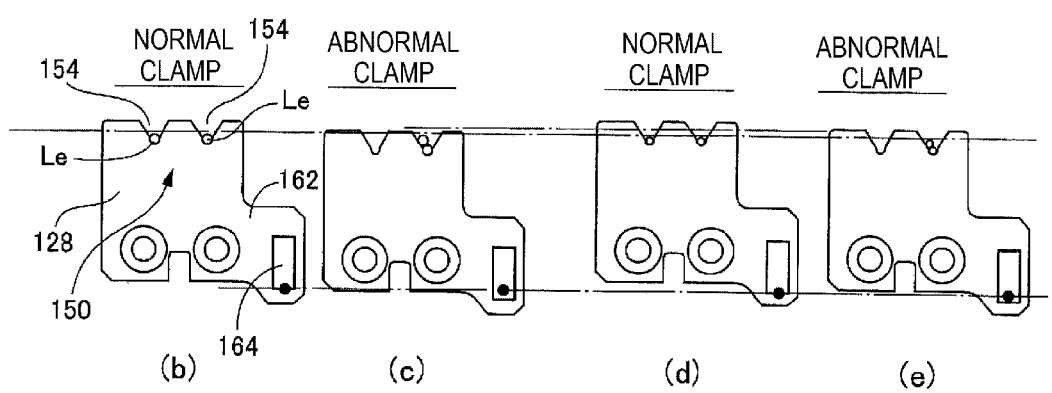

Here, as a certain special case, for example, a case where the lead Le is bent and the component P is inclined is considered. In this case, as illustrated in FIG. 14(a), it is predicted that the two leads Le are guided to one V notch 154. In this case, as an abnormal clamp, as illustrated in FIG. 14(c), the closed position of the clamp 110 is not an appropriate position in a case where the clamp 110 is closed. FIG. 14(b) illustrates a state of the normal clamp, and as can be ascertained from the comparison, in a state illustrated in FIG. 14(c), since the two leads Le overlap each other, the clamp 110 is not closed. The component feeder 26 can also detect the state (hereinafter, there is a case of being called "lead overlapping state") where the multiple leads Le are guided to one V notch 154, regarding the detection target hole 164 provided in the pinching plate 128 as a detection target.

However, it is necessary to consider that the appropriate closed position of the clamp 110 varies in accordance with the diameter of the lead Le, when checking whether or not the closed position of the clamp 110 is an appropriate position. Specifically, in a case of the lead Le having a narrower diameter than that of the lead Le illustrated in FIGS. 14(b) and 14(c), the state of FIGS. 14(d) and 14(e) is achieved, and an appropriate closed position of the clamp 110 varies. Extremely, with respect to the component P of the lead Le illustrated in FIGS. 14(d) and 14(e), in a case of using the pinching plate 128 illustrated in FIGS. 14(b) and 14(c), there is a concern that it is determined that the state of the normal clamp is achieve even in a state of the abnormal clamp.

As described above, in the component feeder 26, depending on the component P to be handled, the pinching plate 128 provided in the guide section 150 is exchanged. In addition, in the pinching plate 128, that is, in the guide section 150, the detection target hole 164 which is a detection target section is provided, and in any of the pinching plates 128, that is, in any of the guide sections 150, the detection target hole 164 is provided at a position that corresponds to the diameter of the lead Le of the component corresponding thereto. As the pinching plate 128 is exchanged, it is possible to save time and labor for adjusting the position of the sensor 166 depending on the component P.

In addition, considering the functions of the clamp closed position checking mechanism 160 described above, the clamp closed position checking mechanism 160 functions as a lead position checking mechanism for checking whether or not the position in the feeding direction of each of the multiple leads Le included in the component P fed to the supply position SS is an appropriate position, at the supply position SS.

v) Feeding Checking Mechanism

At the supply position SS, in order to position the component P, particularly, the lead Le of the component P at a defined position by the positioning mechanism 108 it is assumed that the feeding amount of the taped component TP by the feeding mechanism 70 is appropriate, that is, that the taped component TP is accurately fed only by the feeding pitch p3. Considering this, the component feeder 26 includes the feeding checking mechanism for checking whether or not the taped component TP is fed by the feeding pitch p3 by the feeding mechanism 70.

As illustrated in FIG. 8, a feeding checking mechanism 170 is provided between the feeding mechanism 70 and the positioning mechanism 108 in the feeding direction. In other words, the feeding checking mechanism 170 is provided on the downstream side of the feeding mechanism 70, and is provided on the upstream side of the positioning mechanism 108. In specific description with reference to FIGS. 9 and 10, the feeding checking mechanism 170 is configured to include a pin 172 which is inserted into the feed hole FH punched on the carrier tape CT of the taped component TP, a pin insertion mechanism 174 which inserts the pin 172 into the feed hole FH, and a sensor 176 for detecting whether or not the pin 172 is inserted into the feed hole FH by the pin insertion mechanism 174.

Specifically, the pin 172 is held by a rocking lever 178 that serves as a movable body. As can be ascertained from FIGS. 9(c) and 10(c) which focus on the rocking lever 178 and the pin 172, the rocking lever 178 is held to be oscillatable around a center axis of a shaft hole 180 in the feeder main body as the shaft (not illustrated) is inserted into the shaft hole 180. The rocking lever 178 is biased to the left part by a spring 182 which is a compression coil spring. Meanwhile, in a state where a roller 184 is installed in the support bar 78 described above, and the support bar 78 retreats, as illustrated in FIG. 9, the roller 184 abuts against a vertical wall section 186 of the rocking lever 178 from the left part. Therefore, the pin 172 retreats to a state of being displaced to the right part of the guide rail 62, that is, to a position at which the feeding of the taped component TP is not interrupted.

When the support bar 78 advances, that is, when the taped component TP is fed by the feeding mechanism 70, as illustrated in FIG. 10, the roller 184 advances to the position at which the roller 184 is not engaged with the vertical wall section 186, and the rocking lever 178 is displaced to the left part by the biasing force of the spring 182. Since the pin 172 is positioned further at a front position only at the feeding pitch p3 (which is equal to the hole pitch p2 of the feed hole FH) than the position of the non-return claw 96, in a case where the taped component TP is correctly fed only at the feeding pitch p3 by the feeding mechanism 70, the pin 172 is displaced to the left part and is inserted into the feed hole FH. In other words, the pin insertion mechanism 174 including the roller 184 and the rocking lever 178 is configured. Incidentally, as the support bar 78 retreats, the roller 184 is engaged with the vertical wall section 186, and returns to a state illustrated in FIG. 9.

In the rocking lever 178, a detection target piece 188 is provided, and by the displacement of the pin 172 to the left part, that is, the insertion of the pin 172 into the feed hole FH, the detection target piece 188 also moves to the left part. The sensor 176 detects the movement of the detection target piece 188. The sensor 176 is a type in which the light source and the detection section which detects the light from the light source face each other, and in a case where the pin 172 is appropriately inserted into the feed hole FH, the light from the light source to the detection section is blocked, and it is determined that the pin 172 is inserted into the feed hole FH by the blocking of the light. Incidentally, in a case where the feeding amount is the feeding pitch p3, the pin 172 abuts against a location at which the feed hole FH does not exist in the carrier tape CT, and accordingly, the movement of the pin 172 to the left part is prohibited. In this case, since the detection target piece 188 blocks the light from the light source to the detection section, it is determined that the pin 172 is not inserted into the feed hole FH. In addition, in this case, the feeding amount is not appropriate, and the operation of the component feeder 26 and the operation of the component mounting machine 10 are stopped.

As can be ascertained above, the operation of the feeding checking mechanism 170, specifically, the operation of the pin insertion mechanism 174, is an operation which corresponds to the movement of the support bar 78, and is interlocked with the feeding operation of the feeding mechanism 70. In addition, the distal end of the pin 172 is sharp, and in a case where the feeding amount by the feeding mechanism 70 is slightly shifted from the feeding pitch p3, the shifted state is released by the insertion of the pin 172 into the feed hole FH.

In addition, as a reason why the feeding amount is not the feeding pitch p3, for example, a case where the carrier tape CT is cut as illustrated in FIG. 5(c) at the tail end of the taped component TP, is considered. This is because, in the structure of the above-described feeding mechanism 70, as illustrated in FIG. 5(b), in a case where the carrier tape CT is cut at the center of the feed hole FH, the feeding amount is appropriate, but as illustrated in FIG. 5(c), in a case where the feed hole FH is shifted and cut, the feeding amount becomes small or large. The feeding checking mechanism 170 can check that the feeding amount is not appropriate due to such a reason.

[D] Alternative Embodiment

Figure 15:
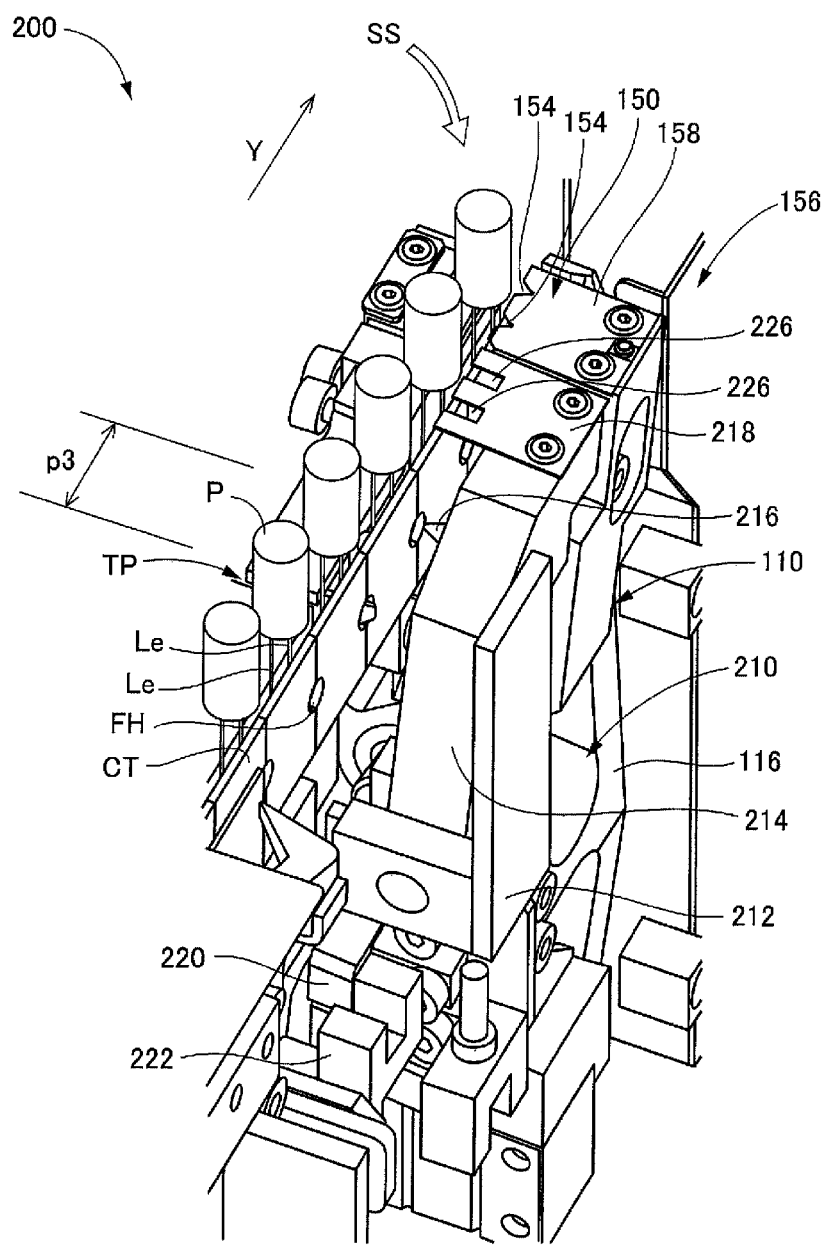
FIG. 15 is a perspective view illustrating a checking mechanism provided in a component feeder of an alternative embodiment.

Instead of the above-described component feeder 26, in the component mounting machine 10, it is possible to employ a component feeder which is an alternative embodiment which will be described hereinafter. As illustrated in FIG. 15, briefly speaking, instead of the feeding checking mechanism 170 and the clamp closed position checking mechanism 160 which are employed in the component feeder 26, a component feeder 200 of the alternative embodiment includes a checking mechanism 210 having a function into which the functions are integrated, on the upstream side of the supply position SS which is the downstream side of the feeding mechanism 70 in the feeding direction. Incidentally, as the positioning mechanism, a positioning mechanism 156 illustrated in FIG. 13(a) is employed.

Specifically, the checking mechanism 210 is generally configured to include a support 212 fixed to a feeder main body, a rocking lever 214 which is held to be oscillatable by the support 212, a pin 216 which is held to be fixed to the rocking lever 214, a comb plate 218 which is attached to the rocking lever 214 to be exchangeable, a detection target piece 220 attached to be fixed to a lower portion of the rocking lever 214, and a sensor 222 which detects the detection target piece 220.

Figure 16:
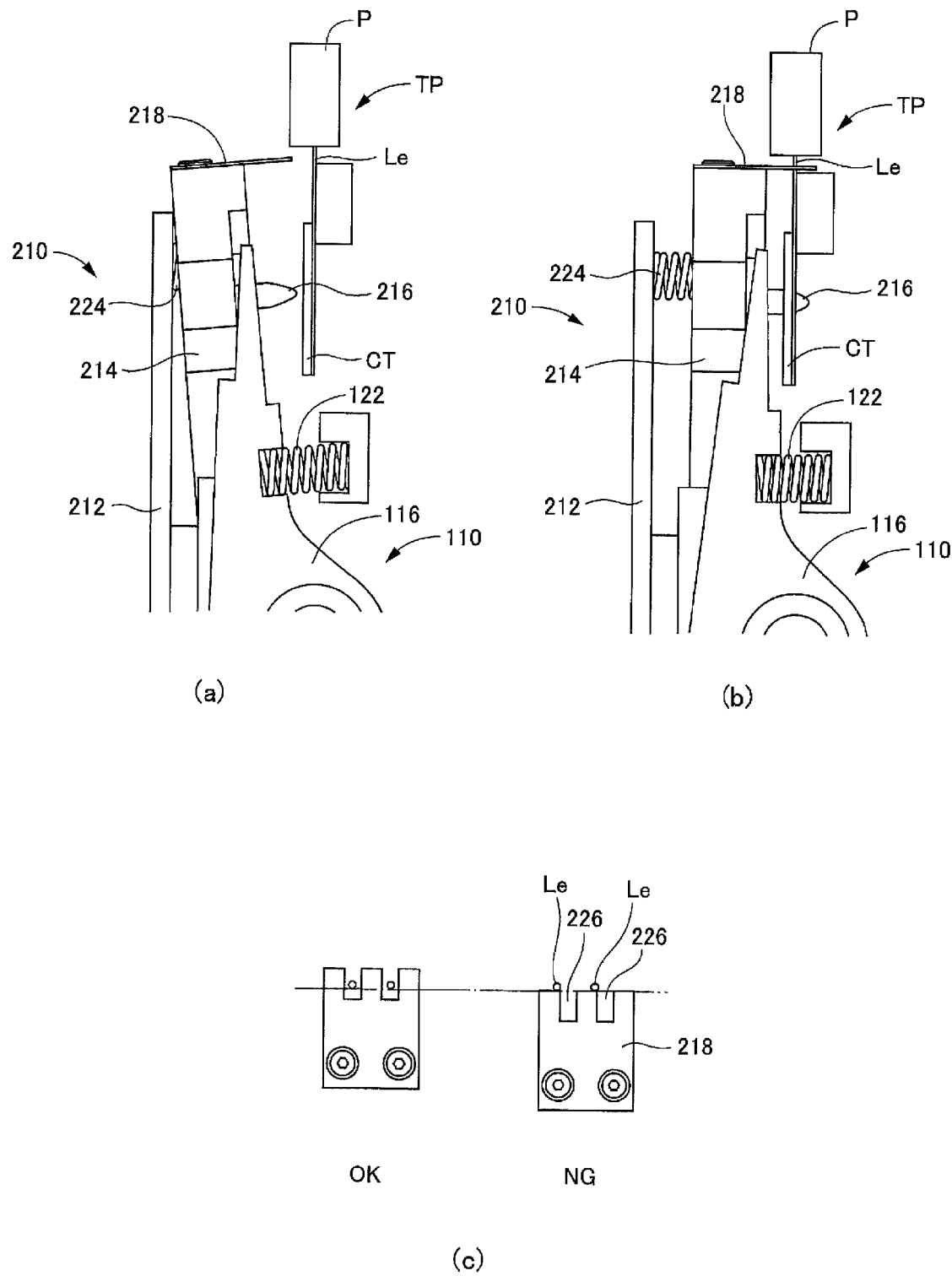
FIG. 16 is a view for illustrating a structure and a function of the checking mechanism.

In the description with reference to FIGS. 16(a) and 16(b) which are schematically illustrated when viewed from the front side, the upper end portion of the rocking lever 214 is biased to the left part (right part in the drawing) by a spring 224 which is a compression coil spring interposed between the rocking lever 214 and the support 212. Meanwhile, the rocking lever 214 is locked by the main lever 116 (in the drawing, the blade 126 is omitted) of the above-described clamp 110, and the rotation of the upper end portion of the rocking lever 214 to the left part (right part of the drawing) is restricted.

FIG. 16(a) illustrates a state where the clamp 110 is open, and in this state, the operation of the upper end portion of the rocking lever 214 to the left part (right part of the drawing) of the drawing is prohibited. In a case where the clamp 110 is closed, as illustrated in FIG. 16(b), the operation is allowed, and the operation by a biasing force of the spring 224 is possible. On the contrary, in a case where the clamp 110 is open from the closed state, the upper end portion of the rocking lever 214 is operated by the rotation of the main lever 116 so as to move to the right part (left part of the drawing). Incidentally, since the rocking lever 214 which is a movable body is operated such that the upper end portion thereof advances and retreats with respect to the lead Le of the component P, hereinafter, regarding the operation of the rocking lever 214, there is a case where an expression of an advancing operation, a retreating operation, and an advancing and retreating operation generally indicating both of them.

In the comb plate 218 attached to the rocking lever 214, corresponding to the lead Le of the component P, multiple cutouts 226 (specifically, two cutouts 226) made in a shape of a slot are provided, and the comb plate 218 functions as a comb section of the checking mechanism 210. Each of the cutouts 226 is open toward the lead Le of the component P similar to the V notch 154 of the guide plate 158 of the positioning mechanism 156, and is formed as a part having a width which is the same as the width of the opening end of the V notch 154. In a case where the position in the feeding direction of each of the leads Le of the component P is an appropriate position, that is, in a case where the position is a position at which guiding to the defined position by the V notch 154 of the guide plate 158 is possible at the supply position SS, as illustrated in a state illustrated as "OK" on the left side of FIG. 16(c), each of the leads Le passes through each of the cutouts 226 in accordance with the advancing and retreating operation of the rocking lever 214.

Meanwhile, in a case where the taped component TP is fed only at the feeding pitch p3 by the feeding mechanism 70, a pin 216 is provided at a position at which the pin 216 can be inserted into one feed hole FH provided on the carrier tape CT in accordance with the advancing operation of the rocking lever 214.

In a case where the rocking lever 214 appropriately performs the advancing operation, the sensor 222 detects the detection target piece 220 provided in the rocking lever 214. The sensor 222 is a type in which the light source and the detection section which detects the light from the light source face each other, and in a case where the rocking lever 214 appropriately performs the advancing operation, the detection target piece 220 blocks the light from the light source.

In a case where the position of any lead Le of the component P is not an appropriate position, as illustrated in a state illustrated as "NG" on the right side of FIG. 16(c), since the distal end of the comb plate 218 is locked to any of the leads Le, the rocking lever 214 cannot appropriately perform the advancing operation. In addition, even in a case where the feeding amount of the taped component TP by the feeding mechanism 70 is not appropriate, since the pin 216 cannot be inserted into the feed hole FH provided on the carrier tape CT, the rocking lever 214, therefore, the rocking lever 214 cannot appropriately perform the advancing operation. In other words, the advancing operation cannot be sufficiently performed. In this case, the sensor 222 does not detect the detection target piece 220, and according to this, it is determined that the taped component TP is not fed at the feeding pitch p3 by the feeding mechanism 70, or that any of the leads Le of the planned component P supplied to the supply position SS is not at an appropriate position. In a case where such determination is not performed, the operation of the component feeder 200 is stopped.

Based on the function of the above-described checking mechanism 210, the checking mechanism 210 is provided on the upstream side of the supply position SS in the feeding direction of the taped component TP, functions as a lead position checking mechanism for checking whether or not the position in the feeding direction of each of the multiple leads Le included in the component P fed to the supply position SS by the feeding mechanism 70 is an appropriate position, and functions as the feeding checking mechanism for checking whether or not the taped component TP is fed at the feeding pitch p3 by the feeding mechanism 70.

An operation of the checking mechanism 210, specifically, the advancing and retreating operation of the rocking lever 214 that serves as the movable body, is interlocked with the opening and closing action of the clamp 110, and the opening and closing operation is interlocked with the operation of the feeding mechanism 70. Therefore, in the component feeder 200, the operation of the checking mechanism 210 is interlocked with the operation of the feeding mechanism 70.

Incidentally, the guide plate 158 and the comb plate 218 are exchanged depending on the component P to be supplied due to the reason described above. In addition, according to the checking mechanism 210, the lead overlapping state described with reference to FIG. 14, that is, the state where the multiple leads Le are guided to one V notch 154, cannot be detected in advance. In order to detect the lead overlapping state in advance, for example, means for reducing the width of the cutout 226 of the comb plate 218 to be approximately smaller than the width of the opening end of the V notch 154 of the guide plate 158, may be considered.

Figure 13:
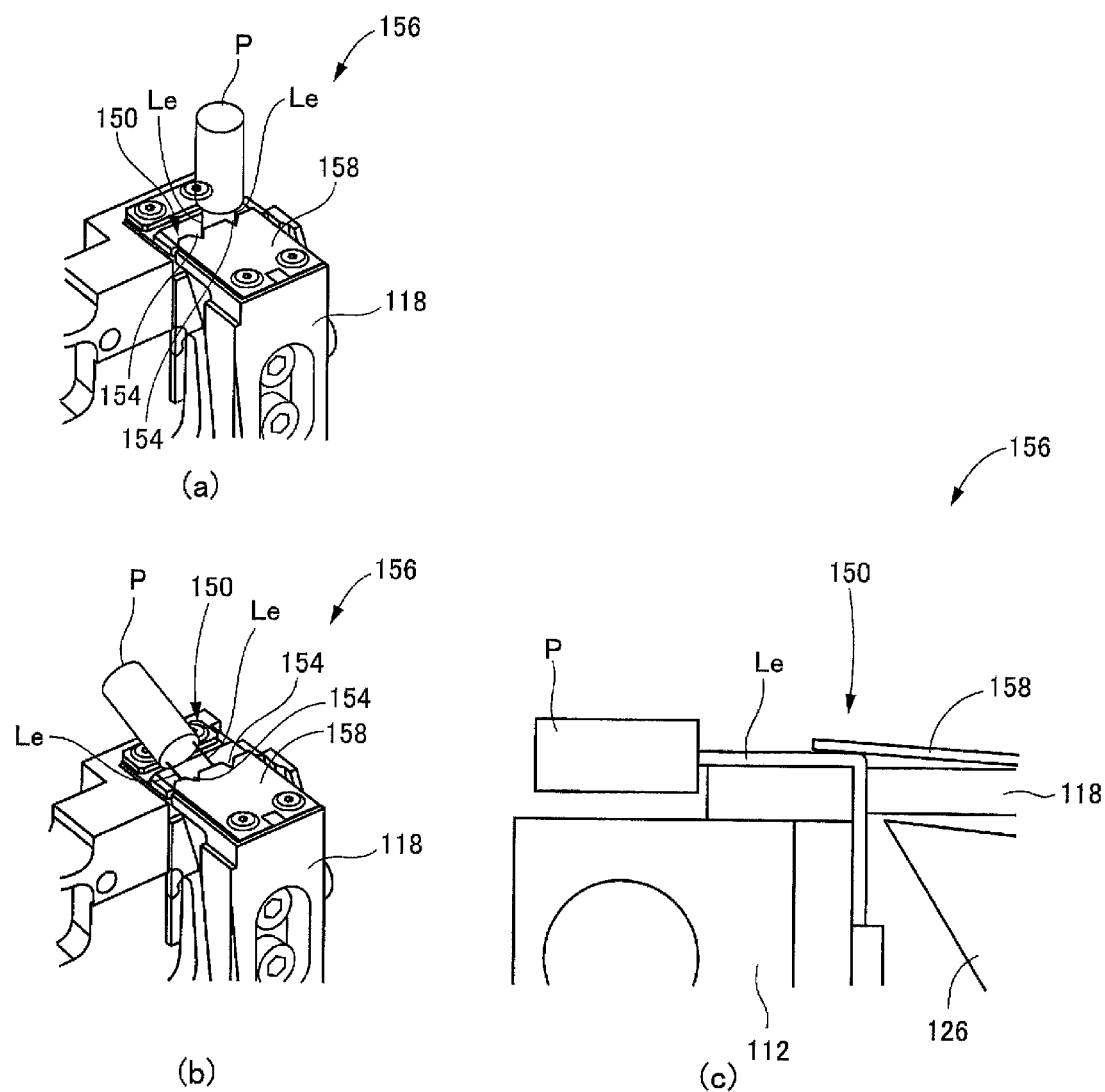
FIG. 13 is a perspective view and a schematic side view illustrating an aspect in which the lead of the component is positioned by the positioning mechanism at a supply position.

In addition, in the component feeder 26 of the embodiment, in order to employ the above-described clamp closed position checking mechanism 160, the positioning mechanism 108 which is supposed to avoid the situation described with reference to FIG. 13, that is, the positioning mechanism which is configured to exchange the pinching plate 128 depending on the component P for each of the pinching plates 128 by integrating the main body section thereof with the protrusion piece section 142, is employed, but in the component feeder 200, since generation of the above-described situation is prevented in advanced by the checking mechanism 210 provided on the upstream side of the supply position SS, the positioning mechanism 156, that is, the positioning mechanism which is configured to exchange only the thin guide plate 158 (guide section) that configures the protrusion piece section 152 by integrating the main body section (pinching section) of the pinching plate 128 with the sub-lever 118 depending on the component P, is employed.

REFERENCE SIGNS LIST

10: component mounting machine, 20: mounting head, 26: component feeder, 36: chuck device, 38: chuck, 60: guide groove, 62: guide rail, 70: feeding mechanism, 84: feeding claw, 86: feeding claw, 96: non-return claw, 108: positioning mechanism, 110: clamp, 112: fixing block [one of the first member and the second member], 114: lever [the other one of the first member and the second member], 116: main lever, 118: sub-lever, 126: blade, 128: pinching plate, 134: pinching surface [pinching section], 136: pinching surface [pinching section], 138: lead cutting mechanism, 150: guide section, 152: protrusion piece section, 154: V notch, 156: positioning mechanism, 158: guide plate, 160: clamp closed position checking mechanism [lead position checking mechanism], 162: overhang section, 164: detection target hole [detection target section], 166: sensor, 170: feeding checking mechanism, 172: pin, 174: pin insertion mechanism, 176: sensor, 178: rocking lever [movable body], 188: detection target piece, 200: component feeder, 210: checking mechanism [lead position checking mechanism] [feeding checking mechanism], 214: rocking lever [movable body], 216: pin, 218: comb plate [comb section], 220: detection target piece, 222: sensor, 226: cutout, p: component, Le: lead, TP: taped component, CT: carrier tape, FH: feed hole, p1: disposition pitch, p2: hole pitch, p3: feeding pitch

The invention claimed is:

1. A component feeder for a mounting apparatus comprising:
   a feeding mechanism which feeds taped components having a plurality of leads held on a carrier tape by the plurality of leads at a predetermined disposition pitch, and a predetermined feeding pitch, and configured to consecutively supply one of the components at a predetermined supply position; and
   a positioning mechanism which positions each of the plurality of leads included in the component at the supply position,
   wherein the positioning mechanism includes
      a clamp comprising a fixing block fixed to a feeder main body and a lever held to be oscillatable in the feeder main body, the fixing block and the lever being operated relative to each other, the clamp configured to perform an action of opening and closing action, and a pinching section provided in each of the fixing block and the lever in a closed state configured to pinch the plurality of leads, the lever includes a main lever of which an upper end portion branches into tow, and a sub-lever which intersects with the main lever, the main lever and the sub-lever being osciallatable around a common shaft, a pinching plate being attached to an upper end of the sub-lever, the pinching plate including a pinching surface and a protrusion piece section protruding from the pinching surface, the protrusion piece section covering the fixing block when the clamp is in the closed state, and the pinching plate and the protrusion piece section being integrated with each other, and
      a guide section which is provided in the pinching plate, and guides each of the plurality of leads to a defined position in a feeding direction of the taped component when the plurality of leads are pinched by the clamp, and wherein the component feeder includes a clamp closed position checking mechanism for checking whether or not a closed position which is an operation position of the clamp in a state where the clamp is closed is an appropriate position.

2. The component feeder according to claim 1, wherein the clamp closed position checking mechanism is configured to include a detection target section provided in the pinching plate and a sensor which regards the detection target section as a target of detection, and to be capable of detecting whether or not the closed position of the clamp is the appropriate position depending on the presence or absence of the detection of the detection target section by the sensor.

3. The component feeder according to claim 2, wherein the pinching plate is exchangeable depending on the one component of the components, and the detection target section is provided at a position that corresponds to a diameter of the plurality of leads.

4. The component feeder according to claim 2, wherein the guide section is configured to be provided corresponding to the plurality of leads, and to include a plurality of V notches.

5. The component feeder according to claim 2, wherein the detection target section is a detecting target hole provided in an overhang section of the pinching plate, and the sensor is a light reflection-type sensor.

6. The component feeder according to claim 5, wherein the pinching surface and the protrusion piece section are provided on a first side of the pinching plate, and the overhang section is provided on a second side of the pinching plate.

7. The component feeder according to claim 1, wherein a blade is attached to an upper end of the main lever, and a roller is attached to a lower end of the main lever, the roller engaging with a cam surface provided on a slide.

* * * * *